(12) United States Patent
Higashi et al.

(10) Patent No.: US 11,879,839 B2
(45) Date of Patent: Jan. 23, 2024

(54) SUBSTRATE PROCESSING APPARATUS AND SUBSTRATE PROCESSING METHOD

(71) Applicant: Tokyo Electron Limited, Tokyo (JP)

(72) Inventors: Koudai Higashi, Koshi (JP); Masato Hayashi, Koshi (JP); Kohei Noguchi, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 176 days.

(21) Appl. No.: 17/386,850

(22) Filed: Jul. 28, 2021

(65) Prior Publication Data

US 2022/0034802 A1 Feb. 3, 2022

(30) Foreign Application Priority Data

Jul. 29, 2020 (JP) .................. 2020-128629

(51) Int. Cl.
*G01N 21/39* (2006.01)
*G01N 21/85* (2006.01)

(52) U.S. Cl.
CPC ............. *G01N 21/39* (2013.01); *G01N 21/85* (2013.01); *G01N 2021/392* (2013.01)

(58) Field of Classification Search
CPC .. G01N 21/39; G01N 21/85; G01N 2021/392; G01N 21/532; G01N 21/53; G01N 21/94; H01L 21/6715; H01L 21/67253; H01L 21/67288; H01L 21/02282; B05B 9/0403; B05B 12/082; B05B 12/1472; B05B 13/0228
USPC ........................................................ 356/442
See application file for complete search history.

(56) References Cited

U.S. PATENT DOCUMENTS

| | | | |
|---|---|---|---|
| 2002/0139925 A1* | 10/2002 | Mitrovic ................ | G01N 21/68 250/226 |
| 2011/0262115 A1* | 10/2011 | Yokouchi ............ | H01L 29/6659 392/407 |
| 2016/0225682 A1* | 8/2016 | Kanno ................ | H01L 21/6708 |
| 2019/0383963 A1* | 12/2019 | Hayashi ............. | G01N 15/1434 |
| 2021/0208194 A1* | 7/2021 | Kasai ................. | G01R 31/2874 |

FOREIGN PATENT DOCUMENTS

| | | |
|---|---|---|
| JP | H05-251328 A | 9/1993 |
| JP | 5591849 B2 * | 9/2014 |
| JP | 2019-220712 A | 12/2019 |

\* cited by examiner

*Primary Examiner* — Md M Rahman
(74) *Attorney, Agent, or Firm* — Pearne & Gordon LLP

(57) ABSTRACT

A substrate processing apparatus includes a supply channel through which a liquid to be supplied to a substrate flows; and a foreign substance detecting unit configured to detect a foreign substance in the liquid based on a signal obtained when light, which is near-infrared light, is radiated toward a flow path forming unit constituting a part of the supply channel by a light projector so that light is emitted from the flow path forming unit and a light receiver receives the light emitted from the flow path forming unit.

17 Claims, 25 Drawing Sheets

SUBSTRATE PROCESSING APPARATUS AND SUBSTRATE PROCESSING METHOD

CROSS-REFERENCE TO RELATED APPLICATION

This application claims the benefit of Japanese Patent Application No. 2020-128629 filed on Jul. 29, 2020, the entire disclosures of which are incorporated herein by reference.

TECHNICAL FIELD

The exemplary embodiments described herein pertain generally to a substrate processing apparatus and a substrate processing method.

BACKGROUND

In a semiconductor device manufacturing process, a processing is performed by supplying various processing liquids to a semiconductor wafer (hereinafter, referred to as a wafer) that is a circular substrate. It is considered to suppress the occurrence of defects in the wafer by detecting a foreign substance in the processing liquids. In Patent Document 1, a liquid processing apparatus equipped with a pipe for supplying a resist to a wafer and a sensor unit, provided at the pipe, serving as a liquid particle counter is described.

Also, in Patent Document 2, an apparatus that radiates a laser beam into a flow path unit through which a fluid flows, and includes a light detecting unit provided on a light path of light that has passed through the flow path unit and a foreign substance detecting unit configured to detect a foreign substance based on the intensity of received light is described.

Patent Document 1: Japanese Patent Laid-open Publication No. H05-251328

Patent Document 2: Japanese Patent Laid-open Publication No. 2019-220712

SUMMARY

In one exemplary embodiment, a substrate processing apparatus includes a supply channel through which a liquid to be supplied to a substrate flows; and a foreign substance detecting unit configured to detect a foreign substance in the liquid based on a signal obtained when light, which is near-infrared light, is radiated toward a flow path forming unit constituting a part of the supply channel by a light projector so that light is emitted from the flow path forming unit and a light receiver receives the light emitted from the flow path forming unit.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

In the detailed description that follows, exemplary embodiments are described as illustrations only since various changes and modifications will become apparent to those skilled in the art from the following detailed description. The use of the same reference numerals in different figures indicates similar or identical items.

DETAILED DESCRIPTION

Figure 1:
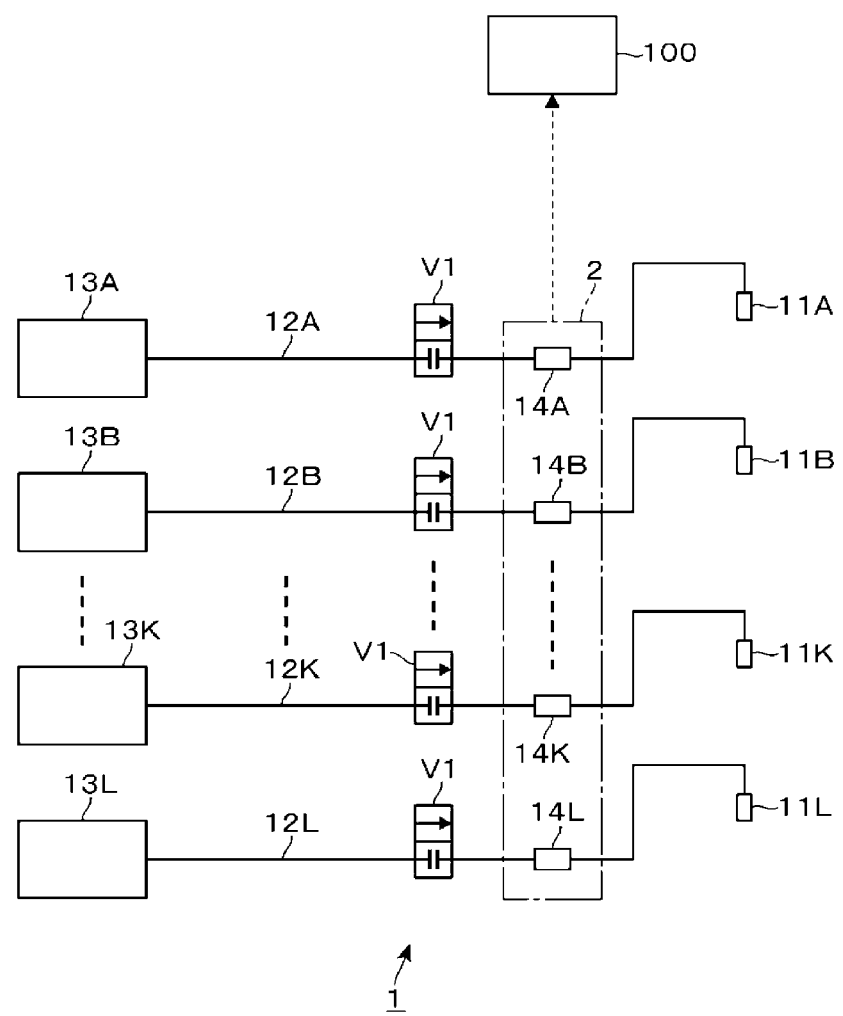
FIG. 1 is a schematic configuration view of an SOC coating apparatus according to an exemplary embodiment of the present disclosure.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other exemplary embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

The following exemplary embodiments are examples for describing the present disclosure, and the present disclosure is not limited thereto. In the following description, same parts or parts having same function will be assigned same reference numerals, and redundant description will be omitted.

A Spin On Carbon (SOC) coating apparatus 1 as a substrate processing apparatus according to an exemplary embodiment of the present disclosure will be described with reference to the schematic diagram of FIG. 1. The SOC coating apparatus 1 supplies a coating liquid for forming a coating film, which is a processing liquid, onto a wafer W, which is a substrate, to form an SOC film having mainly carbon as the coating film. The SOC coating apparatus 1 includes, for example, twelve nozzles 11 (11A to 11L) and among these, eleven nozzles (11A to 11K) discharge coating liquids to form SOC films on the wafer W. The nozzle 11L discharges a thinner onto the wafer W. The thinner is a processing liquid for pre-wetting that is supplied onto the wafer W and increases wettability for a coating liquid for forming an SOC film before the coating liquid is supplied. The SOC coating apparatus 1 includes a foreign substance detecting unit 2 for optically detecting a foreign substance in the coating liquid for forming the SOC film and the thinner. Hereinafter, the term "coating liquid" refers to the coating liquid for forming the SOC film unless expressly stated otherwise.

Downstream ends of processing liquid supply pipes 12 (12A to 12L) serving as supply channels through which processing liquids flow are respectively connected to the nozzles 11A to 11L. Upstream ends of the processing liquid supply pipes 12A to 12K are respectively connected to processing liquid supplies 13A to 13K through valves V1. The processing liquid supplies 13 (13A to 13K) have bottles in which coating liquids are stored, and pumps for pumping the coating liquids from the bottles to the nozzles 11A to 11K, respectively. The kinds of the coating liquids stored in the processing liquid supplies 13A to 13K are different from each other and one kind of coating liquid selected from eleven kinds of coating liquids is supplied onto the wafer W.

A downstream end of the processing liquid supply pipe 12L is connected to the nozzle 11L and an upstream end of the processing liquid supply pipe 12L is connected to the processing liquid supply 13L through a valve V1. The processing liquid supply 13L is configured similar to the processing liquid supplies 13A to 13K except that the thinner is stored therein instead of the coating liquid. Flow path forming units 14 (14A to 14L) are disposed between the nozzles 11A to 11L and the valves V1 in the processing liquid supply pipes 12A to 12L. Accordingly, the flow path forming unit 14 forms a portion of a supply channel through which a liquid to be supplied onto the wafer W flows.

Figure 2:
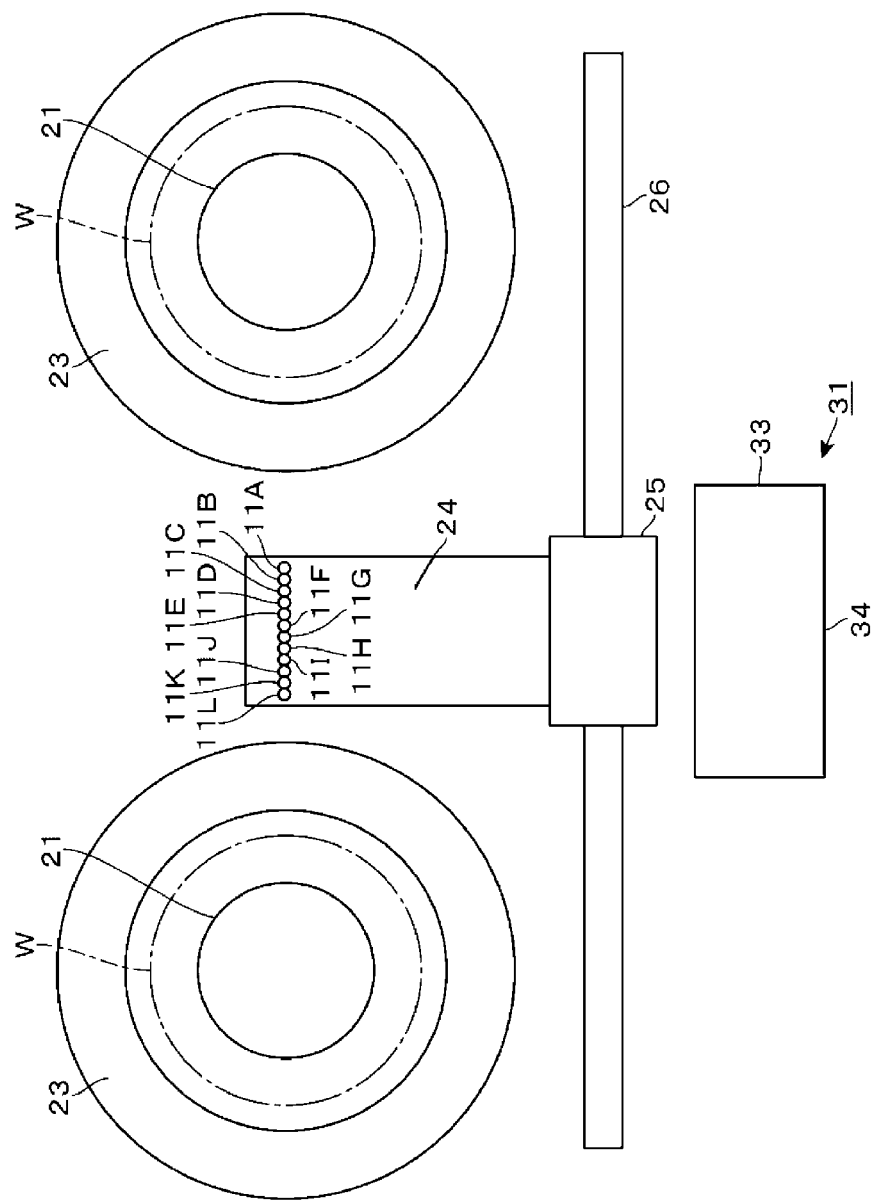
FIG. 2 is a plan view of the SOC coating apparatus.

The plan view of FIG. 2 shows an example of a more detailed configuration of the SOC coating apparatus 1. In the drawings, reference numeral 21 indicates a spin chuck, which forms a substrate placing table that horizontally attracts and holds a center portion of a rear side of a wafer W. Each spin chucks 21 is connected to a rotation mechanism 22 (not shown in FIG. 2) and is rotated while holding the wafer W so that coating of the coating liquid by spinning can be performed. Reference numeral 23 in the drawings indicates a cup surrounding a wafer W to suppress scattering of a processing liquid. In this example, sets of a spin chuck 21, a rotation mechanism 22 and a cup 23 are arranged in a horizontal direction.

Reference numeral 24 in the drawings indicates an arm supporting the nozzles 11A to 11L at a tip end thereof. Reference numeral 25 in the drawings indicates a moving mechanism to which a base end of the arm 24 is connected, and the moving mechanism is engaged with a guide rail 26 that is extended in an arrangement direction of the cups 23. As the moving mechanism 25 moves, each of the nozzles 11A to 11L moves to a position where it can discharge a processing liquid to the center portion of the wafer W held by the spin chuck 21. The guide rail 26 is disposed inside the cups 23, and a housing 31 having a horizontally long rectangular shape is disposed inside the guide rail 26.

The housing 31 will be described further with reference to FIG. 3 which is a longitudinal cross-sectional side view showing the inside of the housing 31, FIG. 4 which is a longitudinal cross-sectional rear view, and FIG. 5 which is a perspective view. In the description, a longitudinal direction of the housing 31 is defined as a left-right direction. The housing 31 is composed of a main body 32, a top cover 33 and a side cover 34. The top cover 33 and the side cover 34 are provided on the main body 32 by fasteners such as screws, so they can be attached to and detached from the main body 32. As described below, the flow path forming units 14 are disposed in a row in the left-right direction inside the housing 31. The top cover 33 forms a wall over the row of the flow path forming units 14, i.e., a wall that is located in a vertical direction, and the side cover 34 forms a wall disposed behind the row of the flow path forming units 14.

The foreign substance detecting unit 2 includes the flow path forming units 14, a light path forming unit 4, a light source 51, an illumination optical system 52 and a counter 53, which are disposed inside the housing 31, and the housing 31. Hereinafter, the foreign substance detecting unit 2 will be generally described. The foreign substance detecting unit 2 is configured such that light is radiated to one selected from the flow path forming units 14A to 14L, and accordingly, light emitted from the selected flow path forming unit 14 can be received by a light receiving element. By receiving the light, detection of a foreign substance in the processing liquid, which is a liquid flowing through the flow path forming units 14 emitting the light, is performed.

The terms "left" and "right" that are used to describe the inside of the housing 31 below are defined as the left and right when the rear is viewed from the front. Accordingly, the components disposed at the right side in FIG. 4, which is a rear view, are actually disposed at the left side. The flow path forming units 14A to 14L are, as described above, arranged left and right in the row in a straight line at positions close to the front and the right side inside the housing 31. The flow path forming units 14A to 14L are disposed with slight gaps therebetween and are fixed with respect to the main body 32 of the housing 31. The flow path forming units 14A to 14L have the same configuration, and the flow path forming unit 14A shown in FIG. 3 will be representatively described. The flow path forming unit 14A has a rectangular shape, is formed into a hexahedral block shape, and is made of quartz or sapphire so as to transmit a laser beam to be described below to optically detect a foreign substance.

A flow path 15 is formed inside the flow path forming unit 14A. The flow path 15 includes a first channel 16, a second channel 17 and a third channel 18 which are sequentially connected toward a downstream side and formed along sides of the flow path forming unit 14A. The first channel 16 is extended horizontally with a downstream side facing the rear, the second channel 17 is extended vertically with a downstream side up, and the third channel 18 is extended horizontally with a downstream side facing the front. Further, an upstream end of the first channel 16 forms an inlet 16A for a processing liquid toward the flow path forming unit 14A and a downstream end of the third channel 18 forms an outlet 18A for a processing liquid from the flow path forming unit 14A. Accordingly, the first channel 16 and the second channel 17 are perpendicular to each other, and the third channel 18 connects the second channel 17 and the outlet 18A.

Further, the inlet 16A and the outlet 18A are both opened at a front end surface of the flow path forming unit 14A and thus are provided on the same surface. Assuming that the first channel, 16, second channel 17 and third channel 18 of the flow path forming unit 14A are partial channels, the partial channels cross one another. Furthermore, a lower surface and an upper surface of the flow path forming unit 14A are respectively provided with antireflection films 9 on a light path of a laser beam radiated in a vertical direction as described below.

A downstream end of a pipe 55 is connected to the inlet 16A of the first channel 16 and an upstream end of a pipe 54 is connected to the outlet 18A of the third channel 18. Thus, a processing liquid flows from the pipe 55 to the pipe 54 through the flow path 15 of the flow path forming unit 14A. The pipes 54 and 55 constitute the processing liquid supply pipe 12A described above with reference to FIG. 1 and are different from the flow path forming unit 14A in that they have flexibility and do not transmit a laser beam. An upstream side of the pipe 55 and a downstream side of the pipe 54 are drawn out from the housing 31 through a front wall of the housing 31.

There are some cases where the flow path 15 of the flow path forming units 14A to 14L may be indicated as 15A to 15L. Since the flow path forming units 14A to 14L are arranged left and right in the row as described above, the flow paths 15A to 15L are also arranged left and right in a row. Although not depicted in FIG. 5, the pipes 54 and 55 are also connected to the flow path forming units 14B to 14L, similar to the flow path forming unit 14A. The processing liquid supply pipes 12B to 12L shown in FIG. 1 are configured by the pipes 54 and 55 connected to the flow path forming units 14B to 14L.

Figure 4:
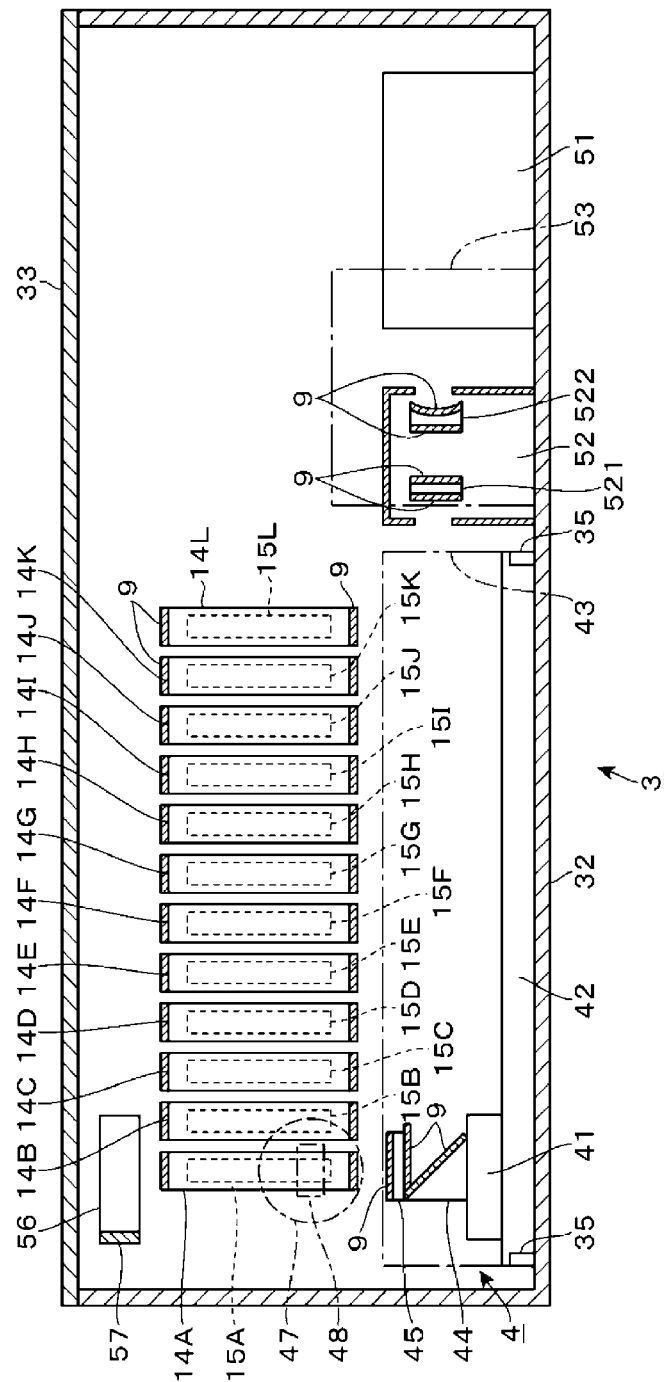
FIG. 4 is a longitudinal cross-sectional rear view of the foreign substance detecting unit.
Figure 5:
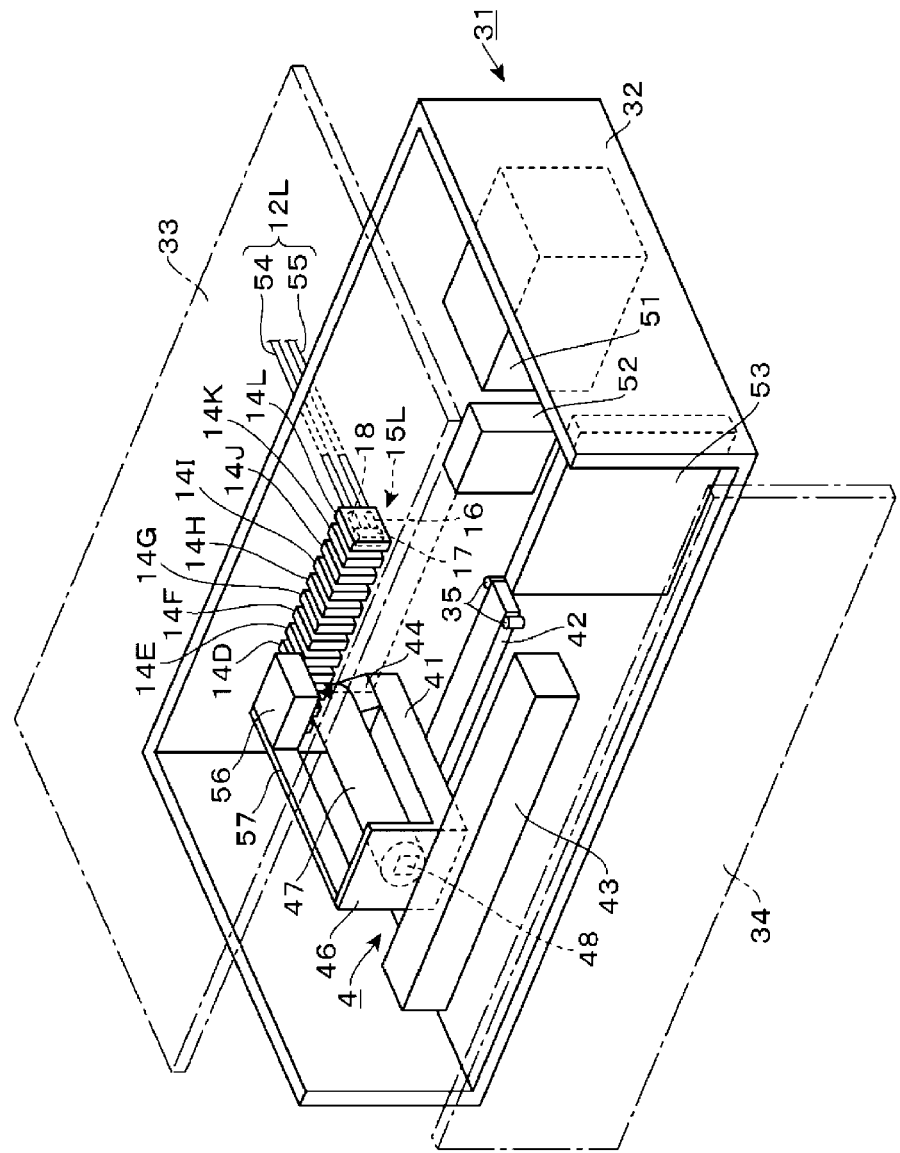
FIG. 5 is a perspective view of the foreign substance detecting unit.

The illumination optical system 52 and the light source 51 are sequentially disposed toward the left side of the row of the flow path forming units 14A to 14L (the right side in FIG. 4). The light source 51 radiates a laser beam, which is near-infrared light for detecting a foreign substance along the direction of the row of the flow path forming units 14A to 14L, toward the illumination optical system 52. In the present disclosure, the near-infrared light refers to light with a wavelength of from 750 nm to 1.4 μm. Radiation of the near-infrared light means radiation of light with a peak wavelength included in this wavelength range. As will be described later in conjunction with a verification test, it is desirable to radiate near-infrared light with a peak wavelength of 830 nm or more from the light source 51, and it is more desirable to radiate near-infrared light with a peak wavelength of 940 nm or more. In the present exemplary embodiment, it is assumed that the peak wavelength is 940 nm. Hereinafter, a wavelength of radiated light refers to a peak wavelength unless expressly stated otherwise.

Figure 7:
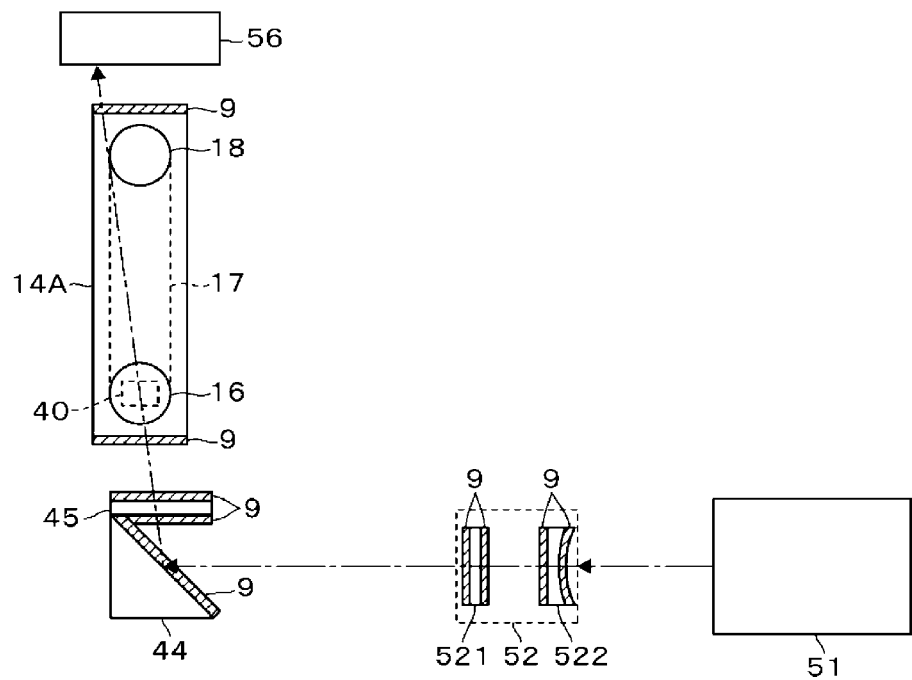
FIG. 7 is a schematic front view of the foreign substance detecting unit.

The illumination optical system 52 includes, for example, a plurality of collimators. FIG. 4 and FIG. 7 to be described below simply illustrate an internal configuration of the illumination optical system 52 and illustrate only some lenses 521 and 522 constituting the collimator. The laser beam radiated from the light source 51 is radiated to the right after the cross-section thereof is shaped by the illumination optical system 52, and then, is radiated to a reflector 44 to be described below. For example, the antireflection films 9 are provided on an incident surface and a radiation surface, respectively, of each of the lenses 521 and 522.

Further, for example, the illumination optical system 52 includes a shutter configured to open/close a light path toward the reflector 44. The laser light is blocked by the shutter when the detection of the foreign substance is not performed. Thus, the light radiation toward the flow path forming units 14A to 14L is not performed. Furthermore, when the detection of the foreign substance is not performed, the output of the light source 51 for generating the laser may be decreased. By performing the minimal output control in this way, the amount of heat generated by the light source 51 is reduced to suppress thermal influence on the surrounding as well as performance deterioration of the light source 51, which makes it possible to use the light source 51 for a long period of time.

Hereinafter, the light path forming unit 4 will be described. The light path forming unit 4 includes a slider 41, a guide rail 42, a moving mechanism 43, the reflector 44, a condenser lens 45, a support 46, a detective optical system 47, a light receiver 48 and a light absorber 56, which are formed as an integrated unit. The slider 41 has a rear end located behind the row of the flow path forming units 14A to 14L and a front end located under the row of the flow path forming units 14A to 14L. Further, the slider 41 is engaged with the guide rail 42 disposed under the slider 41, and the guide rail 42 is extended horizontally. The moving mechanism 43 is disposed behind the guide rail 42, and the slider 41 is connected to the moving mechanism 43. The slider 41 is moved in a longitudinal direction of the guide rail 42, i.e., in the left-right direction, by the moving mechanism 43. The reflector 44 and the condenser lens 45 constituting a first light projector are provided at the front end of the slider 41, and the condenser lens 45 is located over the reflector 44. Further, the condenser lens 45 is omitted in FIG. 5. The reflector 44, the condenser lens 45 and the above-described illumination optical system 52 constitute a front end-side light path forming unit.

The support 46 having a standing plate shape is extended upwards from the rear end of the slider 41. The detective optical system 47, which constitutes a light receiving-side light path forming unit, and the light receiver 48, which is a light receiving element, are sequentially disposed rearwards on the support 46. The detective optical system 47 includes a lens and a band pass filter (BPF) 49, and as described below, light incident on the detective optical system 47 is condensed to be radiated to the light receiver 48 through the BPF 49. The BPF 49 will be described in detail later. Further, an upper end of the support 46 is extended forward to form an arm 57, and the light absorber 56, which is a beam damper, is provided at a tip end of the arm 57.

The slider 41, the reflector 44, the condenser lens 45, the detective optical system 47, the light receiver 48 and the light absorber 56 are moved as a single unit in an arrangement direction of the flow path forming units 14A to 14L (left-right direction) by the moving mechanism 43. The detective optical system 47 and the light receiver 48 are disposed in height corresponding to the channels 16 of the flow path forming units 14A to 14L when they are moved in this manner. Further, the light absorber 56 is disposed facing the reflector 44 with the flow path forming unit 14, to which the light is radiated, among the flow path forming units 14A to 14L, therebetween.

Although not shown, the moving mechanism 43 may be configured to adjust a light receiving distance to the light receiver 48 from the flow path forming unit 14 by changing a distance between the flow path forming units 14 and the light receiver 48. More specifically, there may be provided a mechanism configured to move at least the detective optical system 47 and the light receiver 48 relative to the flow path forming units 14 in a direction different from the arrangement direction of the flow path forming units 14. That is, a light receiving distance is set for each of the flow path forming units 14A to 14L, and the positions of the detective optical system 47 and the light receiver 48 are adjusted to correspond to the light receiving distance of one flow path forming unit 14 when the light is radiated to the corresponding flow path forming unit 14. Accordingly, even if the focus of light radiated from each flow path forming unit 14 to the light receiver 48 is not aligned in the arrangement direction due to a change in shape or position of the flow path forming units 14 by manufacturing or assembling, it is possible to adjust the light receiving distance to match the focus of each flow path forming unit 14. Accordingly, it is possible to detect the foreign substance with a higher accuracy.

Returning to the description of the foreign substance detecting unit 2, the detection of the foreign substance is performed in one selected from the flow path forming units 14A to 14L as described above. When the detection of the foreign substance is performed, the reflector 44 and the condenser lens 45 are located vertically under the selected flow path forming unit 14 at positions corresponding to the flow path forming unit 14. Further, the detective optical system 47 and the light receiver 48 are located behind the selected flow path forming unit 14 at positions corresponding to the flow path forming unit 14. Further, the light absorber 56 is located vertically over the corresponding flow path forming unit 14. FIG. 3 and FIG. 4 show the placement of the components when the flow path forming unit 14A is the selected flow path forming unit 14.

Figure 3:
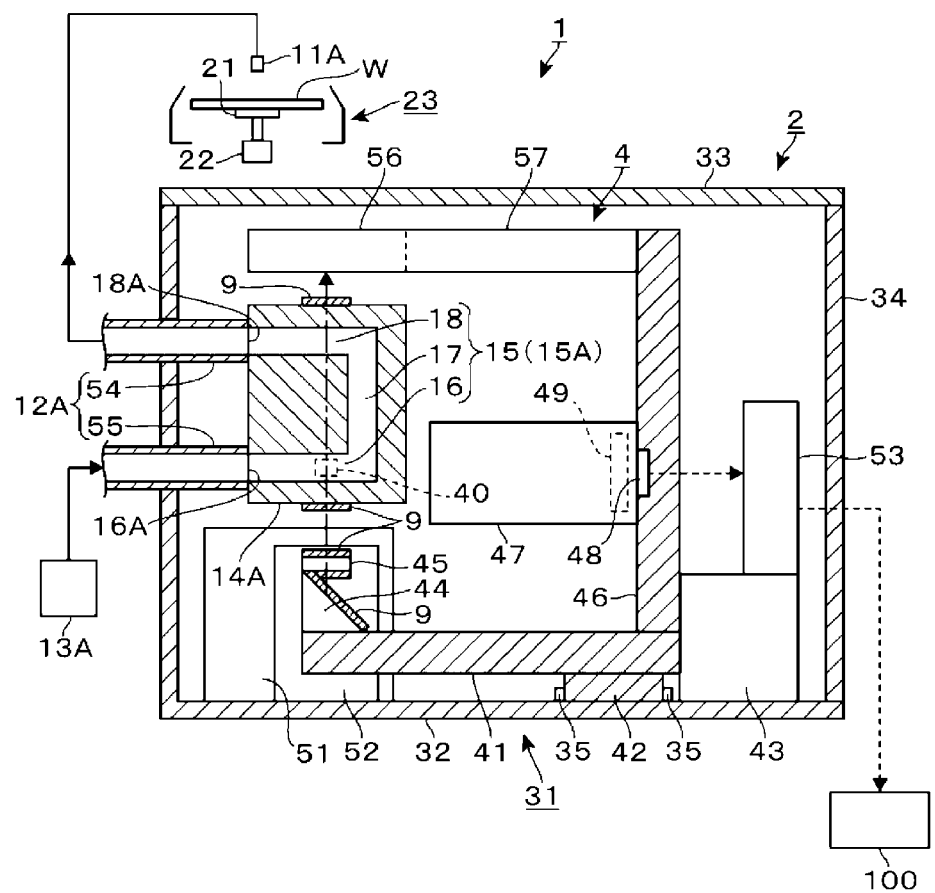
FIG. 3 is a longitudinal cross-sectional side view of a foreign substance detecting unit provided in the SOC coating apparatus.
Figure 6:
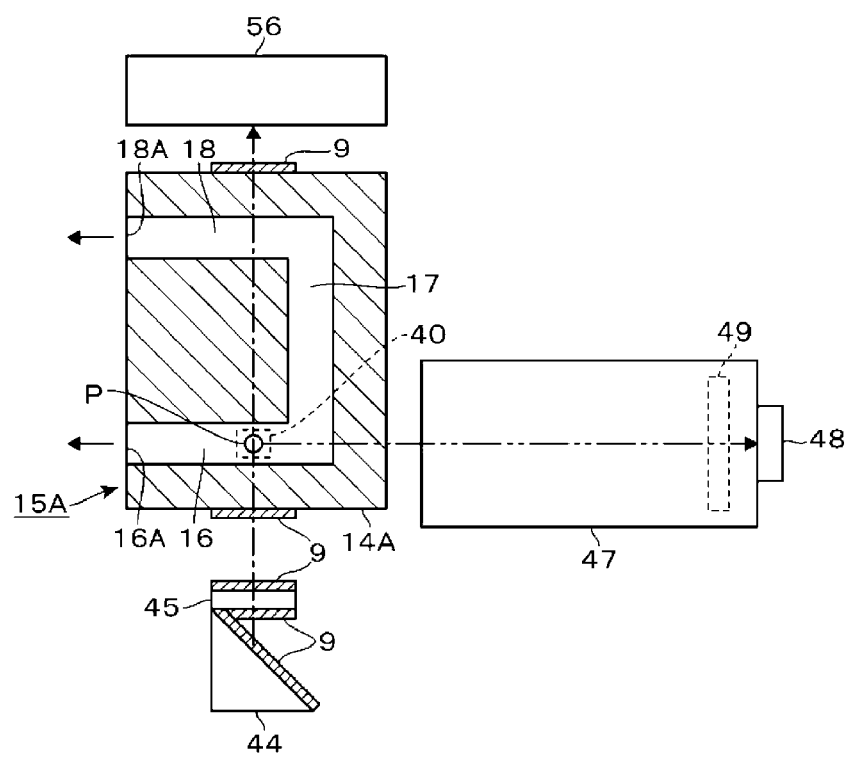
FIG. 6 is a schematic side view of the foreign substance detecting unit.

In FIG. 3, an arrow of a dashed-dotted line indicates the light path. Similarly, the following description also refers to FIG. 6 and FIG. 7 that show the light paths with the arrows of the dashed-dotted line. A laser beam radiated from the light source 51 through the illumination optical system 52 is reflected upwards, i.e., vertically by the reflector 44 to pass through the condenser lens 45. Further, the laser beam passes through the antireflection film 9 formed on the lower surface of the flow path forming unit 14A and is radiated into the first channel 16 perpendicularly to the flow direction of the processing liquid in the first channel 16. Thus, a reaction area 40, which is a light concentration spot with relatively high energy, is formed in the first channel 16. The optical axis of the laser beam passing through the reaction area 40 after being reflected by the reflector 44 is formed slantly upwards when viewed from a front-rear direction without passing through channels other than the first channel 16, i.e., the second channel 17 and the third channel 18. The laser beam that has passed through the flow path forming unit 14A as described above passes through the antireflection film 9 formed on the upper surface of the flow path forming unit 14A, and then, is radiated to the light absorber 56 to be absorbed therein (see FIG. 3 and FIG. 7). While the coating liquid flows through the flow path forming unit 14A, the light path is formed in this manner. Thus, the reaction area 40 is formed. Also, when the foreign substance P enters the reaction area 40 along with the flow of the coating liquid, scattered light is generated.

Further, light radiated into the detective optical system 47, of the scattered light, is radiated to the light receiver 48 through the BPF 49. That is, lateral scattered light toward the second channel 17 (rear side) from the first channel 16 of the flow path forming unit 14 is radiated to the light receiver 48, and the lateral scattered light is shown by a dashed double-dotted line in FIG. 6. The intensity of the scattered light radiated to the light receiver 48 corresponds to the size (granular diameter) of the foreign substance P, and the light receiver 48 outputs an electrical signal with intensity according to the intensity of the received lateral scattered light by performing photoelectric conversion. Further, although a case in which the selected flow path forming unit 14 is the flow path forming unit 14A has been described above, a light path is similarly formed and scattered light is radiated to the light receiver 48 even if another one of the flow path forming units 14B to 14L is selected.

Each antireflection film 9 provided on the light path of the laser beam from the light source 51 to the reaction area 40 of the flow path forming unit 14 reduces the generation of stray light at a portion where the laser beam reaches and thus suppresses the attenuation of the laser beam. That is, it is possible to increase the intensity of light in a transmission direction of each lens and a specular reflection direction of the reflector (mirror). The near-infrared light is used as the laser beam for the reason described below. Thus, the laser beam has relative low energy. Therefore, the suppression of energy loss by the antireflection films 9 as described above is effective in securing a sufficient intensity of the scattered light generated from the reaction area 40 and increasing the accuracy in detection.

The antireflection film 9 is also provided on the light path of the laser beam from the upper surface of the flow path forming unit 14, which constitutes a rear end-side light path forming unit, i.e., the reaction area 40, to the light absorber 56. By this antireflection film 9 and each antireflection film 9 provided on the light path to the reaction area 40, light diffusion-reflected by each component for forming the light path of the laser beam is guided as the stray light to the light receiver 48. Thus, it is possible to suppress the generation of noise in a detection signal output from the light receiver 48. Therefore, each antireflection film 9 is provided to increase the accuracy in detection. Further, the antireflection films 9 may be formed on each component by any method, for example, surface treatment such as deposition or the like.

The BPF 49 has a pass band including a wavelength (940 nm in this case) identical to the wavelength of the laser beam radiated from the light source 51. Therefore, the scattered light radiated to the light receiver 48 is Rayleigh scattered light. The BPF 49 suppresses the generation of noise in the detection signal by cutting a long wavelength component having lower energy than the wavelength of the laser beam, such as fluorescence, generated in the reaction area 40. That is, the BPF 49 increases an SN ratio (signal noise ratio) and increases a difference between the peak of the signal showing the detection of the foreign substance and a background signal. Thus, it is possible to detect the foreign substance with high reliability. For example, the BPF 49 is a narrow band filter having a full width at half maximum of 10 nm or less, and a center wavelength of 940 nm which is identical to the wavelength of the laser beam.

The inside of the housing 31 will be described again with reference to FIG. 3 to FIG. 5. The counter 53 is provided in front of the illumination optical system 52 and the light source 51. The counter 53 has, for example, a substrate equipped with a CPU, etc. For example, the counter 53 is connected to the light receiver 48 by a non-illustrated cable, receives the electrical signal from the light receiver 48, and performs the detection of the foreign substance based on the electrical signal. The detection of the foreign substance includes, for example, counting or classification of the foreign substance, and the counter 53 outputs a detection signal corresponding to the detection result to a controller 100 of the SOC coating apparatus 1. Further, the classification refers to counting of the foreign substance for each predetermined range of sizes.

Hereinafter, the controller 100 of the SOC coating apparatus 1 shown in FIG. 1 and FIG. 3 will be described. The controller 100 is implemented by a computer. For example, the counter 53 is connected to the controller 100. The controller 100 includes a non-illustrated program storage. Programs including instructions (sets of processes) coded to perform forming a resist film and detection of a foreign substance on a wafer W are stored in the program storage. By outputting control signals to the components of the SOC coating apparatus 1 from the controller 100 by the programs, the operations described below are performed. The programs are recorded in a recording medium such as a hard disk, a compact disc, a magneto-optical disc, a memory card or a DVD and stored in the program storage.

Hereinafter, a processing of a wafer W and detection of a foreign substance performed by the SOC coating apparatus 1 will be described with reference to the timing chart of FIG. 8. The timing chart shows a timing when a pressure of the pump in one processing liquid supply 13 of 13A to 13L is corrected and a timing at which the valve V1 of the processing liquid supply pipe 12 of 12A to 12L corresponding to the one processing liquid supply 13 is opened/closed. Further, the timing chart also shows a timing at which the shutter of the illumination optical system 52 is opened and the laser beam is radiated to the light path forming unit 4, a timing at which each component of the light path forming unit 4 is moved, and a timing at which the counter 53 receives the signal obtained from the light receiver 48 and performs the detection of the foreign substance.

First, a wafer W is transferred onto the spin chuck 21 by a non-illustrated substrate transfer mechanism. Then, the nozzle 11L is transferred over the wafer W while being held by the spin chuck 21. Subsequently, the pump of the processing liquid supply 13L suctions the thinner, and the correction is started so that the inside of the pump reaches a predetermined pressure (time t1). For example, the slider 41 of the light path forming unit 4 is moved in parallel with the movement of the nozzle 11L and the operation of the pump. Further, the reflector 44 and the condense lens 45 are located under the flow path forming unit 14L, the detective optical system 47 and the light receiver 48 are located behind the flow path forming unit 14L, and the light absorber 56 is located over the flow path forming unit 14L.

Subsequently, the nozzle 11L is stopped over the wafer W (time t2). Next, the valve V1 of the processing liquid supply pipe 12L is opened and the thinner is force-fed toward the nozzle 11L from the pump. When the thinner is force-fed, the laser beam is radiated toward the reflector 44 from the light source 51 to be reflected upwards by the reflector 44 as described above with reference to FIG. 3, FIG. 4, etc. Thus, the reaction area 40 is formed in the flow path forming unit 14L (time t3). When the foreign substance enters the reaction area 40 formed in the flow path forming unit 14L, the scattered light is generated to be radiated to the light receiver 48 through the detective optical system 47.

Meanwhile, the force-fed thinner passes through the flow path 15 of the flow path forming unit 14L and is then discharged to the center portion of the wafer W from the nozzle 11L. When a predetermined degree of opening is achieved, the valve V1 is no longer opened (time t4). Thereafter, the liquid flow in the flow path 15 is stabilized, the counter 53 starts to obtain the signal from the light receiver 48 (time t5), and the detection of the foreign substance is performed. Next, the counter 53 stops the obtaining of the signal from the light receiver 48 (time t6), the light source 51 stops radiating light, the valve V1 of the processing liquid supply pipe 12L is closed (time t7), and the discharge of the thinner to the wafer W is stopped. The wafer W is rotated, and the discharged thinner is diffused to a peripheral portion of the wafer W by centrifugal force. Thus, pre-wetting is performed.

Next, the coating liquid stored in any one of the processing liquid supplies 13A to 13K is supplied to the wafer W. In this case, it is assumed that the coating liquid in the processing liquid supply 13A is supplied to the wafer W. When the coating liquid in the processing liquid supply 13A is supplied to the wafer W, the nozzle 11A is located over the wafer W instead of the nozzle 11L, and the thinner is not supplied from the processing liquid supply 13L and the coating liquid is supplied from the processing liquid supply 13A to the nozzle. Further, the valve V1 of the processing liquid supply pipe 12A is opened/closed instead of the valve V1 of the processing liquid supply pipe 12L. Furthermore, each component of the light path forming unit 4 moves to the position corresponding to the flow path forming unit 14A rather than moving to the position corresponding to the flow path forming unit 14L. Thus, the light path is formed in the flow path forming unit 14A.

Figure 8:
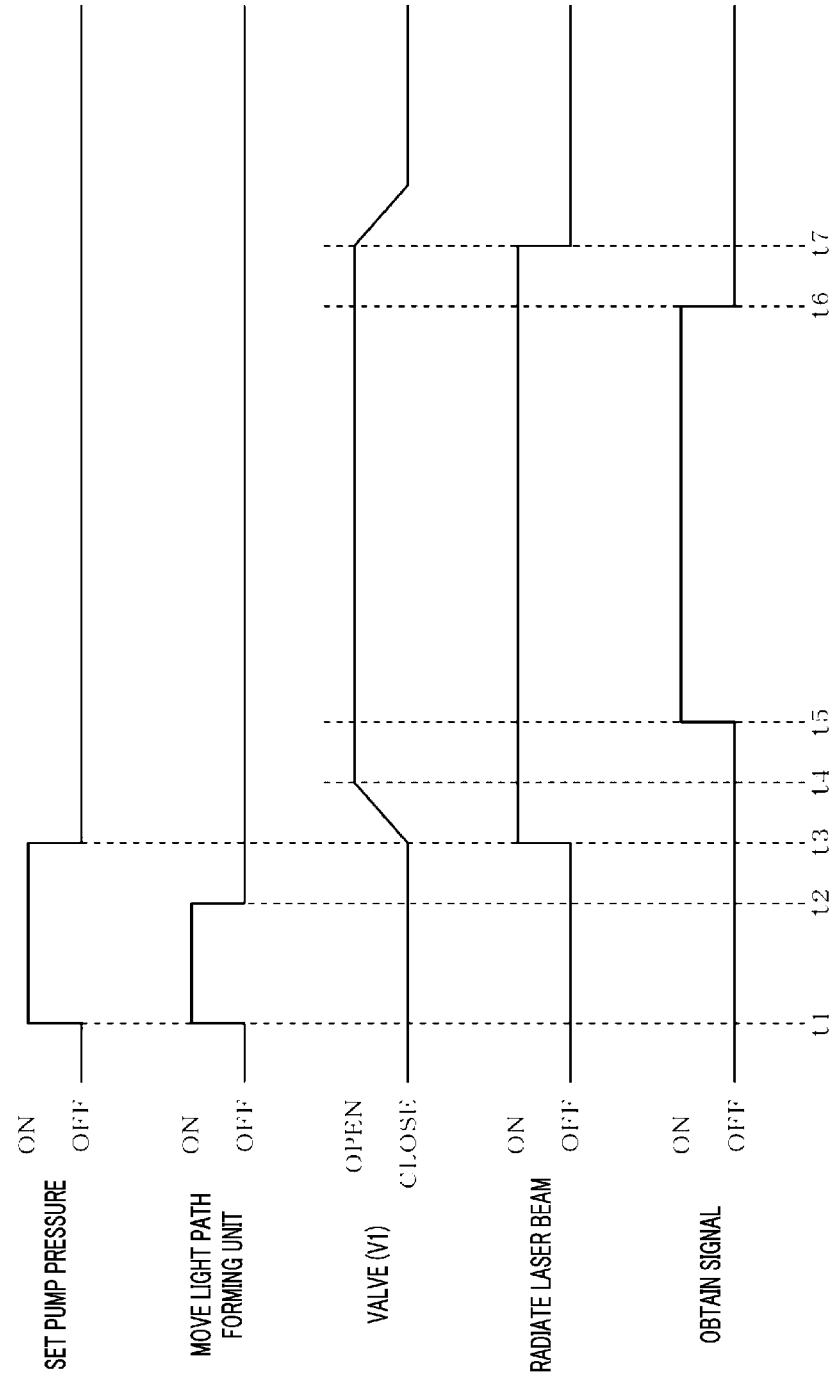
FIG. 8 is a timing chart of an operation of the SOC coating apparatus.

Except for such a difference, each component is operated in accordance with the timing chart of FIG. 8, similar to when the thinner is supplied to the wafer W. Accordingly, while the coating liquid is supplied to the wafer W, the foreign substance in the coating liquid is detected. The coating liquid supplied to the wafer W is spin-coated on the surface of the wafer W by the rotation of the wafer W to form the SOC film. Thereafter, the wafer W is transferred from the spin chuck 21 by the substrate transfer mechanism.

A problem of the conventional art will be described in explaining the reason for radiating the near-infrared light to the SOC coating apparatus 1 by the light source 51. As described in Patent Document 2, the apparatus configured to optically detect the foreign substance in the fluid by radiating light to the flow path of the fluid has been disclosed.

Visible light, which is visible and easy to handle, is considered to be used as the light to be radiated to the fluid.

However, the present applicant has discovered that when the detection is performed by radiating the visible light, it may not be possible to detect the foreign substance in the colored liquid, such as the coating liquid, with a sufficient accuracy. This is because the visible light is absorbed by the colored liquid, i.e., liquid with relatively high absorbance. More specifically, if the detection is performed by radiating the visible light to the flow path forming unit 14 in the SOC coating apparatus 1, the visible light is absorbed by the coating liquid for forming the SOC film. As a result, the intensity of the scattered light generated from the flow path forming unit 14 may decrease. Thus, the accuracy in detection may decrease.

Therefore, in the SOC coating apparatus 1, the near-infrared light is radiated as described above. As will be described later in conjunction with a test result, even a colored liquid has a relatively low absorbance of the near-infrared light. Therefore, in the SOC coating apparatus 1, when the foreign substance in the coating liquid is detected, the intensity of the scattered light generated from the flow path forming unit 14 can be secured, and, thus, the detection of the foreign substance can be performed with a high accuracy. Although the thinner used in the SOC coating apparatus 1 is colorless, it is possible to detect the foreign substance even in the colorless liquid in the same manner as in the colored liquid, such as the coating liquid, by radiating the near-infrared light. Therefore, the SOC coating apparatus 1 is configured to detect the foreign substance in various kinds of liquids. Also, as the wavelength of the laser beam radiated to the flow path forming unit 14 increases, the absorption of the laser beam by the liquid decreases. However, since the intensity of the scattered light is in inverse proportion to the fourth power of the wavelength of excitation light, if the wavelength of the laser beam is too long, the intensity of the scattered light decreases, so that the accuracy in detection may decrease. Therefore, it is desirable to use the near-infrared light as the laser beam instead of mid-infrared light having a longer wavelength than that of the near-infrared light.

Also, as the amount of the laser beam absorbed by the liquid increases, the amount of heat generated increases, and an inner surface of the flow path forming unit 14 may be damaged by the generated heat. When the absorption of the laser beam by the coating liquid is suppressed by radiating the near-infrared light as the laser beam, the heat generation can be suppressed. Thus, damage to the flow path forming unit 14 can be suppressed. Further, since the heat generation is suppressed, the deterioration of the coating liquid can be suppressed.

Further, the light absorber 56 is provided opposite to the reflector 44 with the flow path forming unit 14 therebetween. Accordingly, radiation of the laser beam that has passed through the flow path forming unit 14 to a wall of the housing 31 and radiation of the reflected light into the light receiver 48 can be suppressed. Thus, noise in the output signal from the light receiver 48 is further reduced, and the accuracy in detection of the foreign substance can be increased. The light absorber 56 may be provided for each of the flow path forming units 14 inside the housing 31, but as described above, it is desirable that the light absorber 56 is shared by the flow path forming units 14 by moving the light absorber 56 along the row of the flow path forming units 14. Thus, it is possible to reduce the manufacturing cost. Further, instead of the light absorber 56, for example, a ceiling surface (a lower surface of the top cover 33) of the housing 31 may be configured to absorb the laser beam. Specifically, the ceiling surface may be coated with paint configured to absorb the laser beam. Further, in this case, for example, heat radiating fins protruded out of the housing 31 may be provided as cooling members on the top cover 33 to suppress an increase in temperature of the top cover 33 that absorbs the light.

Meanwhile, the housing 31 may be laid on its side or may be turned upside down. That is, the positions of components are not limited to the positions described above with respect to the flow path forming unit 14. Specifically, with respect to the flow path forming unit 14, the light receiver 48 may be vertically located, the reflector 44 may be horizontally located, and the flow path forming unit 14 may be vertically located.

Figure 9:
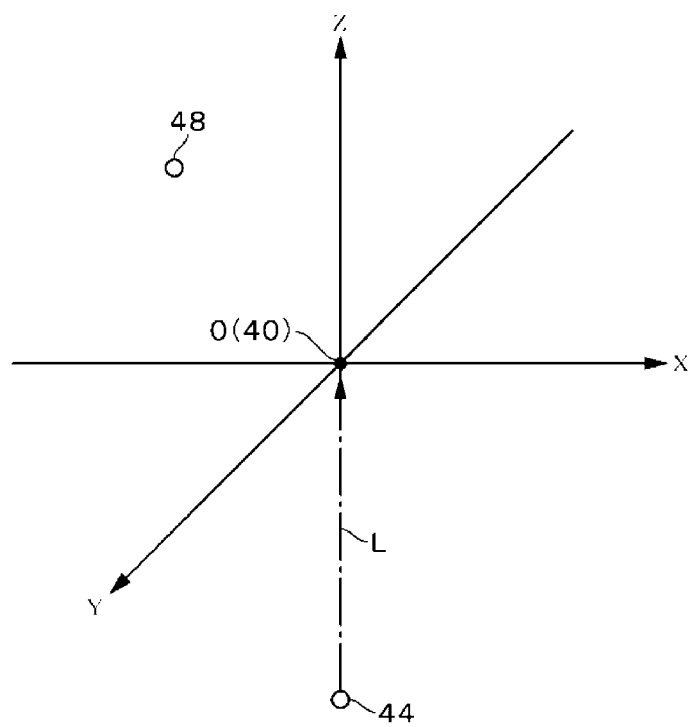
FIG. 9 is an explanatory diagram showing a positional relationship in the components of the foreign substance detecting unit.

Further, when the detection of the foreign substance is performed by receiving the scattered light, the positional relationship of the flow path forming unit 14, the light projector and the light receiver 48 is not limited to the specific examples shown in the drawings. The positional relationship will be further described with reference to FIG. 9 showing a 3D coordinate system. In FIG. 9, it is assumed that the origin is the reaction area 40 formed in the flow path 15 of the flow path forming unit 14. Accordingly, in the coordinate system, an X-axis direction is the left-right direction when viewed from the reaction area 40, a Y-axis direction is the front-rear direction when viewed from the reaction area 40, and a Z-axis direction is the up-down direction when viewed from the reaction area 40. As described above, the light projector and the light receiver 48 are provided in areas that are not opposite to each other among up, down, left, right, front and rear areas with respect to the flow path forming unit 14. That is, when the light is radiated from the reflector 44, which is the light projector, to the reaction area 40 and an optical axis L is formed, the light receiver 48 is not provided in an extension direction of the optical axis L passing through the origin.

Since the light receiver 48 is not provided as described above, it is possible to suppress an increase in size of the foreign substance detecting unit 2 that is caused when the light projector and the light receiver are disposed with the flow path forming unit therebetween. The optical axis L (indicated by an arrow of a dotted line) is formed by the reflector 44 along the Z-axis in the example shown in FIG. 9. Accordingly, the light receiver 48 just needs to be not disposed on the Z-axis. Similarly, for example, when the optical axis L is formed along the X-axis by the reflector 44, the light receiver 48 is not disposed on the X-axis. Further, the light projector has been described as the reflector 44 with reference to FIG. 9, but the light projector described herein is a member that projects light such that the direction of a light path finally leading toward the reaction area is determined. Accordingly, for example, it may be possible to provide the light source 51 on the slider 41 and then radiate the laser beam directly to the flow path forming unit 14 from the light source 51 without passing through the reflector 44, and in this case, the light projector is the light source 51.

Further, the radiation position of the laser beam on the flow path forming unit 14 is not limited to the example described above. However, if a flowing direction of the processing liquid in the reaction area 40 formed by the radiation of the laser beam is parallel to a laser beam radiation direction, light is continuously radiated on the foreign substance flowing in the flow path. Thus, accurate detection cannot be performed. Therefore, the light is radiated such that the directions are not parallel to each other but cross each other. Further, the term "cross" stated herein includes "perpendicular" and "slantly crossing" within its meaning. For the flow path forming unit 14 in the configuration example described above, the processing liquid is supplied upwards from a lower portion, but the supply direction is not limited thereto.

Figure 10:
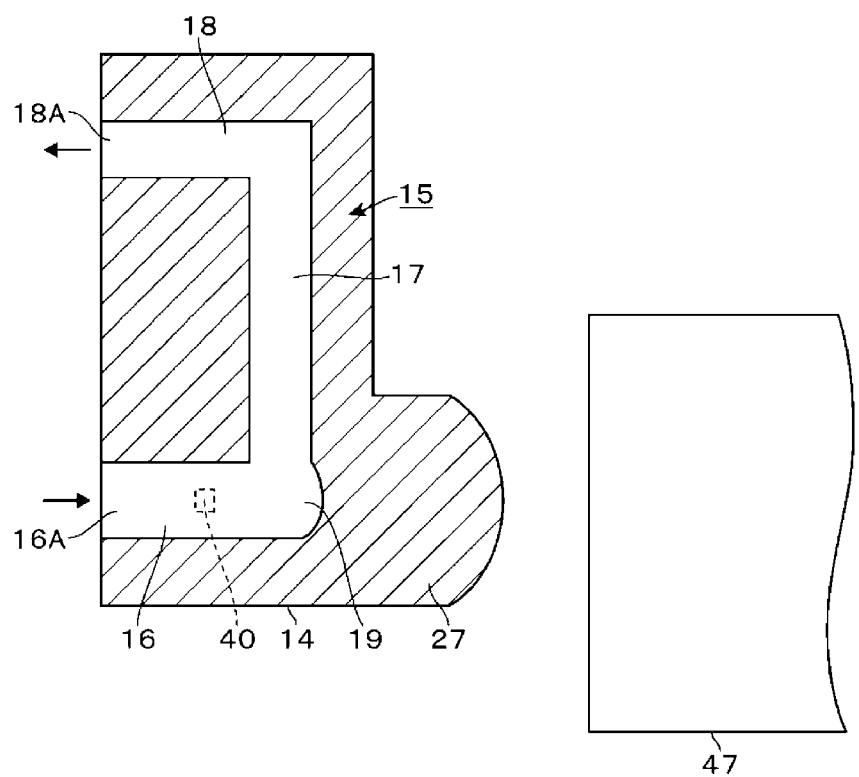
FIG. 10 is a longitudinal cross-sectional side view showing a modification example of a flow path forming unit provided in the foreign substance detecting unit.
Figure 11:
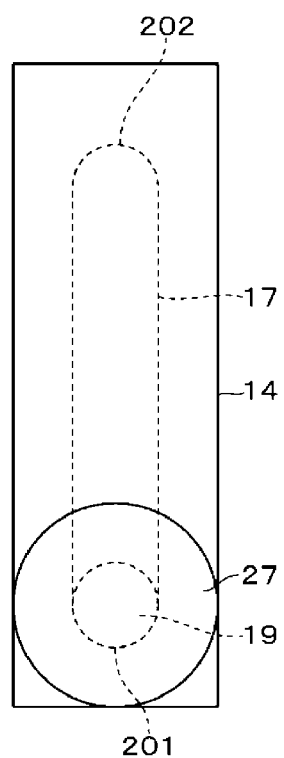
FIG. 11 is a rear view of the modification example of the flow path forming unit.

A configuration example of another flow path forming unit 14 is shown in FIG. 10 and FIG. 11, and FIG. 10 and FIG. 11 are respective longitudinal cross-sectional side view and rear view of the flow path forming unit 14. In this example, as described with reference to FIG. 3, the flow path 15 of the flow path forming unit 14 includes a first channel 16, a second channel 17, and a third channel 18. A lower end of the flow path 15 protrudes rearwards to form a spherical lens portion 19 that protrudes to form a convex lens shape when viewed from the second channel 17. Further, crossing portions 201 and 202 where partial channels constituting the flow path 15 cross each other have a curvature. More specifically, in the example shown in FIG. 11, left and right corners of an upper end and a lower end of the second channel 17 when viewed toward the front are rounded. Thus, the upper end and the lower end are formed in a semicircular shape, and the crossing portions 201 and 202 having the curvature described above are formed.

The reason for providing the crossing portions 210 and 202 having the curvature is to suppress the flow of the processing liquid from staying at curved portions of the flow path 15. When the foreign substance remains in the reaction area 40 by the staying, particles may be generated. However, by providing the crossing portions 201 and 202, it is possible to more reliably suppress the occurrence of this problem. Further, a lower end of a rear end surface of the flow path forming unit 14 protrudes rearwards to form a convex lens portion 27. The centers of the spherical lens portion 19 and the convex lens portion 27 are aligned in the front-rear direction. The convex lens portion 27 or the spherical lens portion 19 is provided to increase the accuracy in detection by more reliably guiding the lateral scattered light from the reaction area 40 to the detective optical system 47.

Figure 12:
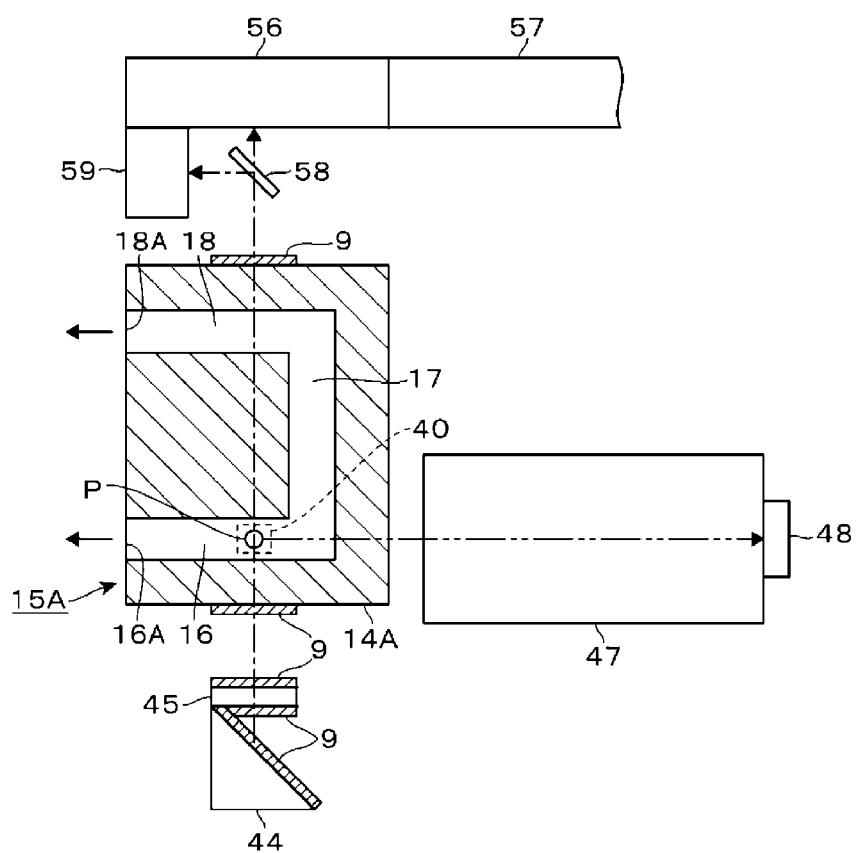
FIG. 12 is a schematic side view showing a mechanism provided in the foreign substance detecting unit and configured to detect a laser beam.

Since the laser beam radiated to the flow path forming unit 14 is, for example, the near-infrared light with the wavelength of 940 nm, it is invisible to the eye. Therefore, a mechanism configured to detect whether the radiation of the laser beam is normally performed may be provided, and the mechanism may be configured to easily adjust a radiation position of the laser beam on the flow path forming unit 14 or an angle of the laser beam. FIG. 12 shows a configuration example of the foreign substance detecting unit 2 provided with the mechanism. The differences of the configuration example shown in FIG. 12 from that shown in FIG. 3 will be described below. In the configuration example shown in FIG. 12, a half mirror 58 serving as the rear end-side light path forming unit is provided above the row of the flow path forming units 14 and fixed to the arm 57 via a non-illustrated support. Also, a camera 59 configured to capture the near-infrared light is fixed to the arm 57. Therefore, the half mirror 58 and the camera 59 can be moved together with the light receiver 48 or the like along the row of the flow path forming units 14 by a moving mechanism 4.

Further, the laser beam that has passed the reaction area 40 of the flow path forming unit 14 is guided to each of the light absorber 56 and the camera 59 by the half mirror 58. When the laser beam is radiated, the camera 59 may capture an image so that image data can be obtained. A user of the apparatus determines whether there is abnormality based on a position of the laser beam on the image (i.e., a position of the laser beam in the field of view of the camera). If there is abnormality, each component of the light path forming unit 4 is adjusted. Also, the image data obtained by the camera 59 may be transmitted to the controller 100. The controller 100 may determine whether there is abnormality based on the image data and may notify the user of the abnormality by a warning device, e.g., an alarm, connected to the controller 100.

The camera 59 may be placed at any position where the light guide to the camera 59 is hardly affected by the detection of the foreign substance, and a member for forming the light path may be aligned with that position. That is, a position of the camera 59 is not limited to the above-described position, and the member for the light guide to the camera 59 is not limited to the half mirror 58. Also, a transmitted light detector is not limited to being configured by the camera 59. For example, instead of the camera 59, a plurality of light receiving elements may be disposed and the detection may be performed to identify which one of the light receiving elements outputs the detection signal when the laser beam is radiated to the flow path forming unit 14, and, thus, information about the position of the laser beam may be obtained. Otherwise, the light absorber 56 may not be provided, and all the transmitted light of the flow path forming unit 14 may be directed toward the camera 59.

When the laser beam is radiated to the reaction area 40, the scattered light is generated from each of the foreign substance P and the liquid flowing through the reaction area 40. More specifically, the scattered light is also generated from each of a solvent of the coating liquid and a polymer dissolved in the solvent. As the intensity of the scattered light generated from ingredients of the coating liquid increases, a difference between a signal level of the foreign substance P and a signal level of the liquid decreases. That is, since the SN ratio decreases, the sensitivity to the foreign substance P may decrease. The configuration example shown in FIG. 13 suppresses the effect of the scattered light generated from the ingredients of the coating liquid.

Figure 13:
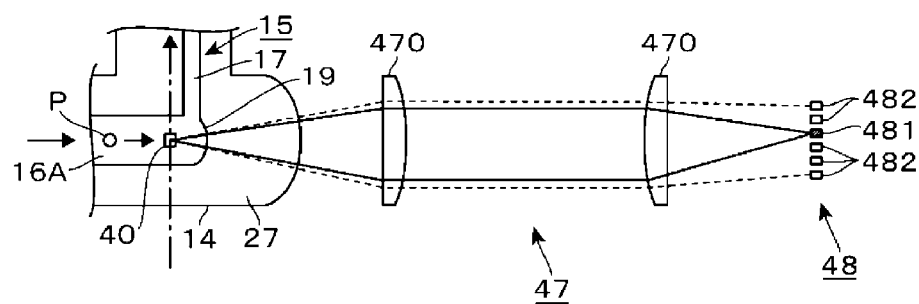
FIG. 13 is a schematic side view showing a modification example of a detective optical system provided in the foreign substance detecting unit.

Differences of a configuration example shown in FIG. 13 from that shown in FIG. 3 will be described below. According to the configuration shown in FIG. 13, a plurality of light receivers 48 is provided in a light radiation area of the detective optical system 47. Further, in the detective optical system 47, the scattered light generated from the foreign substance P in the reaction area 40 is selectively condensed to one of the light receivers 48 (denoted by 481 in the drawing) by a lens 470 of the detective optical system 47, and the scattered light generated from the liquid in the flow path 15 is radiated to each of the light receivers. Any light receiver other than the light receiver 481 is denoted by 482.

The controller 100 performs detection of the foreign substance P based on time-series data of signal levels obtained by the light receiver 481. The controller 100 serving as a foreign substance detector calculates a difference between time-series data of signal levels obtained from the light receiver 481 and, for example, time-series data of signal levels obtained from any one light receiver 482, and detects the foreign substance P based on the difference in time-series data. The difference in time-series data excludes an effect of the scattered light generated from the ingredients of the coating liquid. Thus, the SN ratio is high and the detection of the foreign substance P can be performed with a high accuracy. Further, with the time-series data obtained from each light receiver 48, the foreign substance P may be detected by performing the comparison operation as described above. Also, with the time-series data obtained from, for example, the light receiver 482, the foreign substance P may be detected by performing a Fast Fourier Transform (FFT), specifying a waveform of a frequency component caused by the polymer and then comparing the waveform of the frequency component with a waveform of a signal level of the light receiver 481. As such, the time-series data of signal levels obtained from the light receiver 48 may be used after a certain process (data processing).

Figure 14:
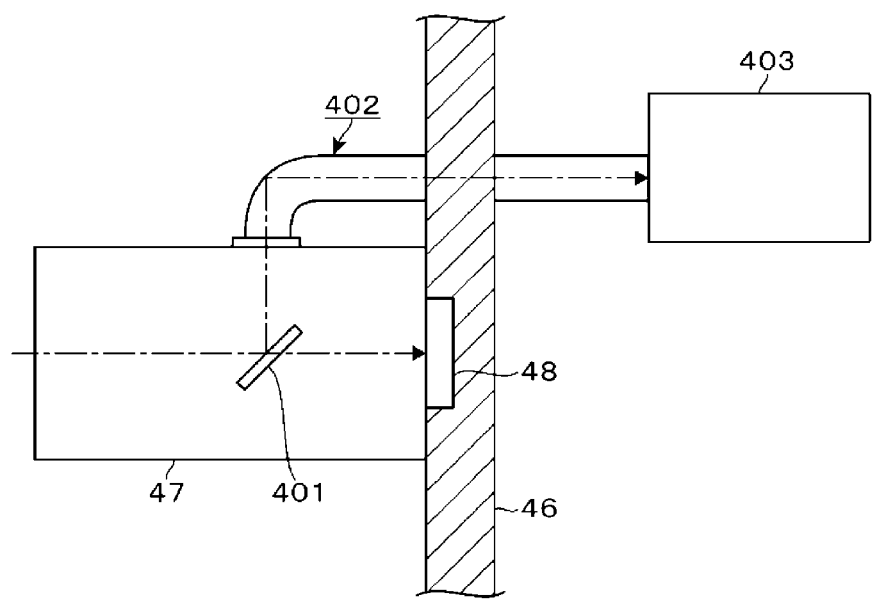
FIG. 14 is a schematic side view showing another modification example of the detective optical system provided in the foreign substance detecting unit.

Differences of another configuration example of the foreign substance detecting unit 2 shown in FIG. 14 from that shown in FIG. 3 will be described below. In the configuration example shown in FIG. 14, a spectrometer 403 is provided, and the light path of the scattered light generated from the flow path forming unit 14 are branched into the light receiver 48 and the spectrometer 403. The detective optical system 47 is provided with a half mirror 401, and a part of the scattered light passes through the half mirror 401 to be radiated to the light receiver 48, and another part of the scattered light is reflected by the half mirror 401 to be incident on an optical fiber 402 and then guided to the spectrometer 403, and, thus, a spectrum is obtained. The half mirror 401 and the optical fiber 402 constitute a branch light path forming unit.

For example, when the concentration of the coating liquid flowing through the flow path forming unit 14 is out of a reference range, the spectrum to be obtained is changed. Therefore, it is possible to monitor whether the concentration is abnormal by monitoring the spectrum. Further, for example, assuming that a channel at an upstream side of the flow path forming unit 14 are branched and a liquid to be supplied to the flow path forming unit 14 can be switched between the coating liquid for forming the SOC film and another processing liquid, whether the switch of the liquid is normally performed may be monitored by monitoring the spectrum. The user may monitor the spectrum. For example, when the spectrum data is transmitted to the controller 100 from the spectrometer 403, the controller 100 may combine the spectrum data with reference spectrum data to monitor and determine whether there is abnormality.

Figure 15:
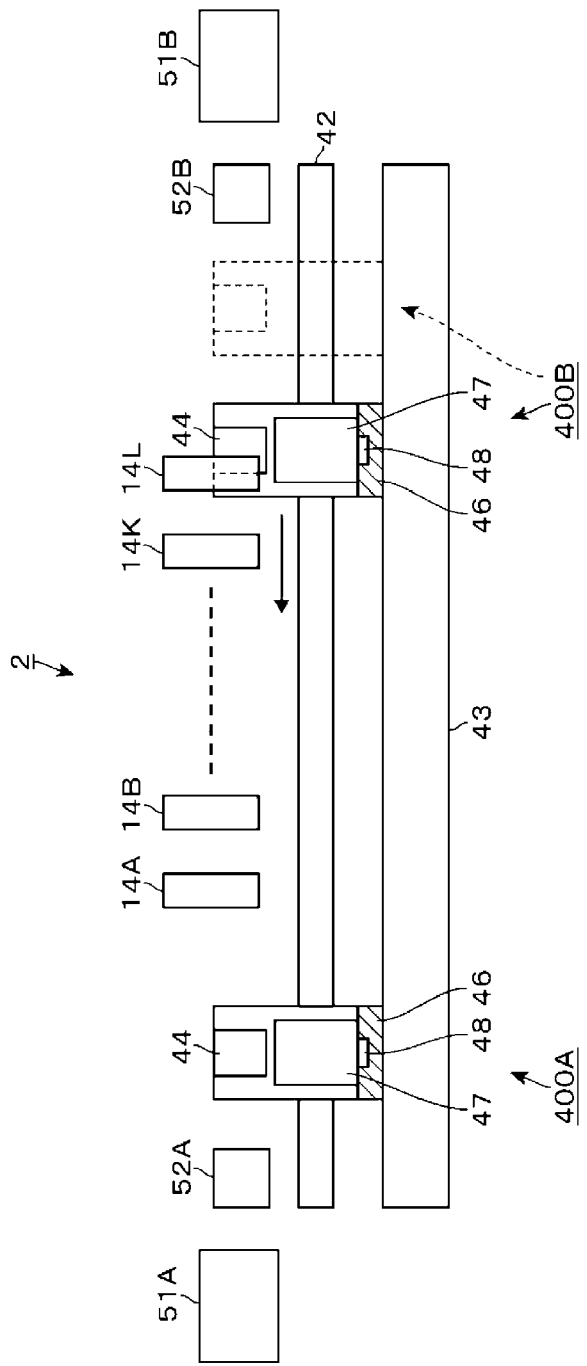
FIG. 15 is a top view showing a modification example of the foreign substance detecting unit.

In the foreign substance detecting unit 2, first light and second light which have different wavelengths from each other and at least one of which is the near-infrared light may be selected and radiated to the flow path forming unit 14. FIG. 15 shows such a configuration example. In this configuration example, the flow path forming units 14A to 14L are provided with a set (first detection set) 400A of the light source 51, the illumination optical system 52 and the light path forming unit 4 and a set (second detection set) 400B of the light source 51, the illumination optical system 52 and the light path forming unit 4. Hereinafter, each component included in the first detection set 400A will be assigned "A" behind a reference numeral thereof, and each component included in the second detection set 400B will be assigned "B" behind a reference numeral thereof.

A light source 51A has the same configuration as the light source 51 described above with reference to FIG. 3 and radiates a laser beam with a wavelength of 940 nm. A light source 51B radiates, for example, visible light with a wavelength of 532 nm as the laser beam. The light source 51A and an illumination optical system 52A are provided at one end side of the guide rail 42, and the light source 51B and an illumination optical system 52B are provided at the other end side of the guide rail 42. Directions of laser beams radiated from the light sources 51A and 51B are opposite to each other. Further, the moving mechanism 43 moves the light path forming unit 4A of the first detection set 400A and the light path forming unit 4B of the second detection set 400B independently of each other along the direction of the row of the flow path forming units 14. Also, the antireflection films 9 and the BPF 49 provided in the light path forming unit 4A may correspond to the wavelength of the laser beam from the light source 51A and the antireflection films 9 and the BPF 49 provided in the light path forming unit 4B may correspond to the wavelength of the laser beam from the light source 51B.

Each flow path forming unit 14 shown in FIG. 15 is supplied with a liquid, for example, one of a transparent resist and a coating liquid for forming an SOC film, from an upstream side, and the liquid to be supplied can be switched. The first detection set 400A is a set for detecting a foreign substance in the coating liquid, and the second detection set 400B is a set for detecting a foreign substance in the resist. The light path forming unit 4A and the light path forming unit 4B are moved to positions for detection of a foreign substance depending on the kind of the liquid to be supplied to the flow path forming unit 14 where the detection of the foreign substance is to be performed, and then perform the detection. Further, for example, while one of the light path forming unit 4A and the light path forming unit 4B is moved along the row of the flow path forming units 14, the other stands by at a position deviating from the row of the flow path forming units 14 in the left-right direction so as not to interfere with the movement. In the drawing, the standby position of the light path forming unit 4B is indicated by a dotted line, and the light path forming unit 4A is illustrated as being in a standby state at the standby position.

As described above, the resist used in the present exemplary embodiment is transparent. Thus, even if the wavelength of the laser beam to be radiated is low, an absorbance of the laser beam is low. Further, when the wavelength is low, the intensity of the scattered light can be increased. Therefore, the accuracy in detection of the foreign substance can be increased. That is, according to the present exemplary embodiment, the wavelength of the laser beam to be radiated is changed depending on the kind of the liquid, and, thus, the accuracy in detection of the foreign substance in each of the coating liquid and the resist can be increased.

Further, as will be described below, a common foreign substance detecting unit 2 may be provided in a plurality of substrate processing apparatuses using different chemical liquids. In this case, substrates in the respective substrate processing apparatuses may be processed in parallel. However, even in this case, a plurality of detection sets is provided as shown in FIG. 15, and, thus, the detection may be performed to one flow path forming unit 14 and another flow path forming unit 14 independently of each other. Therefore, in the foreign substance detecting unit 2, the foreign substance may be detected by radiating the light to two flow path forming units 14 at the same time. Further, the foreign substance may be detected in each flow path forming unit 14 by continuously radiating light between two flow path forming units 14, i.e., by stopping the radiation of light to one flow path forming unit 14 and starting the radiation of light to another flow path forming unit 14 at the same time. Also, three or more detection sets may be provided.

Another configuration of the foreign substance detecting unit 2 will be described. This foreign substance detecting unit 2 is configured to detect the foreign substance in each of the coating liquid and the resist like the configuration example shown in FIG. 15. In this foreign substance detecting unit 2, the light source 51 is configured as a wavelength variable light source configured to change a wavelength of a laser beam and configured to radiate laser beams with the above-described wavelengths when the detection of the foreign substance in the coating liquid is performed and when the detection of the foreign substance in the resist is performed, respectively. Further, as shown in FIG. 3, only one light path forming unit 4 and only one illumination optical system 52 are provided. Each antireflection film 9 formed on the light path forming unit 4, the illumination optical system 52 and the flow path forming unit 14 may correspond to a relatively broad wavelength band.

Figure 16:
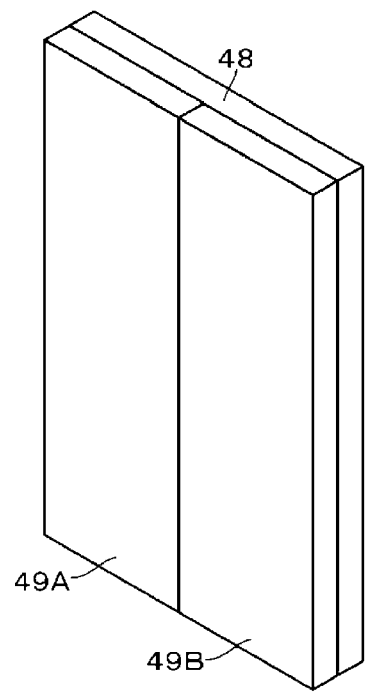
FIG. 16 is a perspective view of a light receiver provided in another modification example of the foreign substance detecting unit.

Further, in the present exemplary embodiment, the BPF 49 is composed of a filter (first BPF 49A) corresponding to the laser beam for the detection of the foreign substance in the coating liquid and a filter (second BPF 49B) corresponding to the laser beam for the detection of the foreign substance in the resist, and these filters are switchably used. The first BPF 49A and the second BPF 49B overlap a light receiving area of the light receiver 48 and are disposed in the left-right direction (along the row of the flow path forming units 14A to 14L) as shown in FIG. 16. As in each of the above-described examples, the relative positions of the light receiver 48 and the detective optical system 47 are fixed. That is, the first BPF 49A and the second BPF 49B are moved together with the light receiver 48 by the moving mechanism 43.

The first BPF 49A has the same configuration as the BPF 49 provided in the foreign substance detecting unit 2 described above with reference to FIG. 3. A pass band of the second BPF 49B is different from that of the first BPF 49A and includes a wavelength of 532 nm which is identical to the wavelength of the laser beam for the detection of the foreign substance in the resist. That is, the second BPF 49B is configured to allow Rayleigh scattered light to pass through. For example, the second BPF 49B is a narrow band filter having a full width at half maximum of 10 nm or less and has a center wavelength of 532 nm which is identical to the wavelength of the laser beam for the detection of the foreign substance in the resist.

Figure 17:
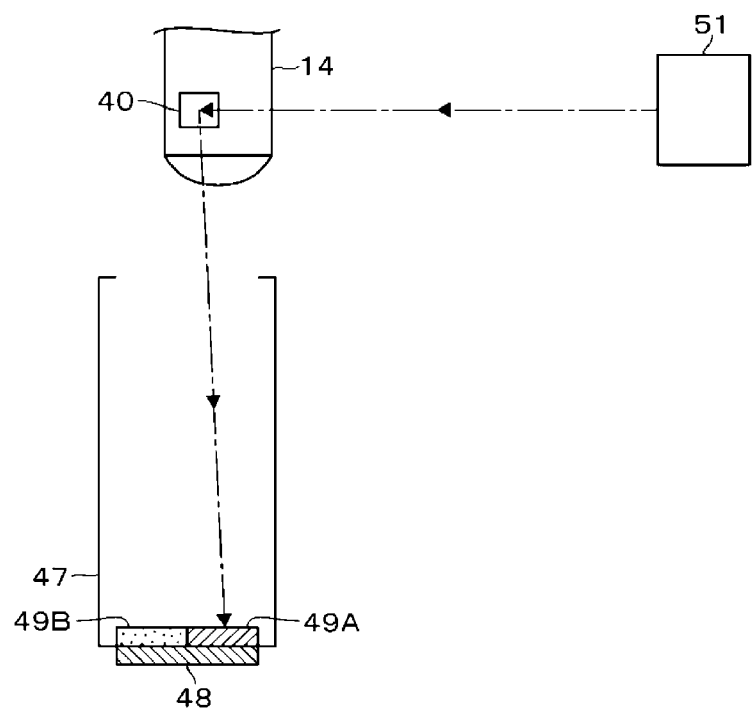
FIG. 17 is an explanatory diagram showing an operation of another modification example of the foreign substance detecting unit.
Figure 18:
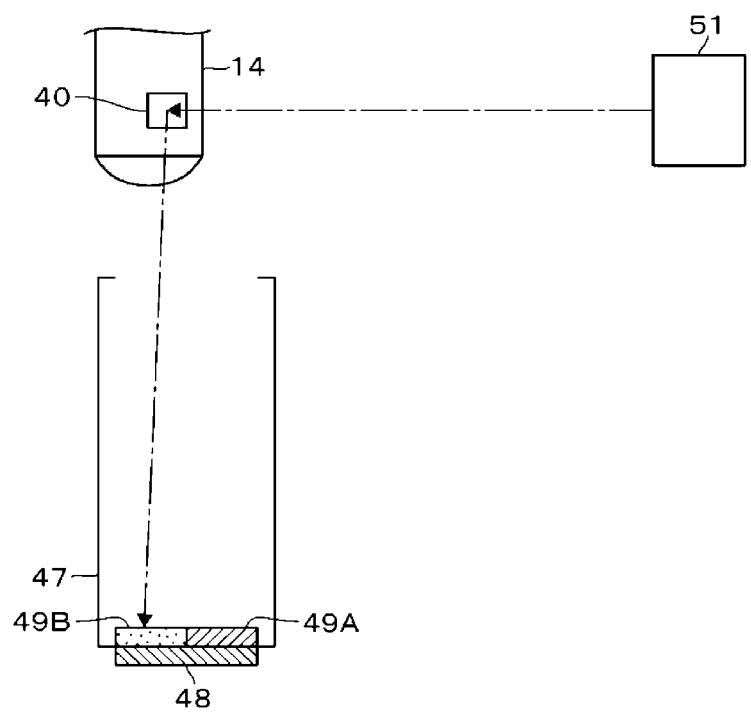
FIG. 18 is an explanatory diagram showing an operation of another modification example of the foreign substance detecting unit.

Since the first BPF 49A and the second BPF 49B are provided as described above, one of the left and right sides or the other side of the light receiver 48 receives the scattered light. A detailed description will be made with reference to FIG. 17 and FIG. 18. When a laser beam with a wavelength of 940 nm is used for detecting the foreign substance in the coating liquid, the detective optical system 47 and the light receiver 48 are located such that the first BPF 49A is located behind the flow path forming unit 14 where the detection is performed as shown in FIG. 17. Accordingly, the scattered light generated from the flow path forming unit 14 is radiated to the right side of the light receiver 48 through the first BPF 49A, and, thus, the detection is performed. When a laser beam with a wavelength of 532 nm is used for detecting the foreign substance in the resist, the detective optical system 47 and the light receiver 48 are located such that the second BPF 49B is located behind the flow path forming unit 14 where the detection is performed as shown in FIG. 18. Accordingly, the scattered light generated from the flow path forming unit 14 is radiated to the left side of the light receiver 48 through the second BPF 49B, and, thus, the detection is performed.

Also, in the foreign substance detecting unit 2, when the detective optical system 47 and the light receiver 48 are moved, the radiation position of the laser beam on the flow path forming unit 14, i.e., the position of the reaction area 40, is also moved. That is, a positional relationship of the reaction area 40, the detective optical system 47 and the light receiver 48 is not changed. For this reason, the flow path forming unit 14 is configured as a lens configured to condense the scattered light generated from the reaction area 40 and radiate the light. Further, the flow path forming unit 14 may be designed to switch the concentration and the radiation of the scattered light to the first BPF 49A side or the concentration and the radiation of the scattered light to the second BPF 49B side depending on, for example, the movement in position of the reaction area 40 in the flow path forming unit 14.

As described above, in the exemplary embodiment shown in FIG. 16 to FIG. 18, when the first BPF 49A and the second BPF 49B are switchably used to detect the foreign substance in different kinds of liquids, the moving mechanism 43 that moves each component of the light path forming unit 4 is used as a mechanism for switching the filters. That is, without a mechanism exclusively for switching the filters, the moving mechanism 43 (first relative position moving mechanism) switches the filters by moving a relative position of the flow path forming unit 14 with respect to the first BPF 49A and the second BPF 49B. Since the mechanism exclusively for switching the filters is not necessary, it is possible to reduce the manufacturing cost and easily perform the maintenance. Here, a moving mechanism exclusively for moving the relative position may also be provided.

When a laser beam is radiated to a liquid, the intensity of scattered light generated from a particle is theoretically in proportion to the sixth power of the diameter of the particle. Therefore, if particles contained in the liquid have a great difference in size, a change in level of detection signals output from the light receiver 48 increases. However, in the counter 53 that receives the signals from the light receiver 48, a range of measurable signal levels is constant. If the signal level input into the counter 53 is out of the measurable range, an amplifier and an attenuator need to be provided to adjust the signal level to the measurable range. Further, if there is a very great difference in intensity of the scattered light, a plurality of amplifiers and a plurality of attenuators for adjusting the level of the detection signal to the measurable range of the counter 53 need to be provided for each range of intensities of the scattered light, which may cause an increase in size of a circuit provided in the foreign substance detecting unit 2.

Figure 19:
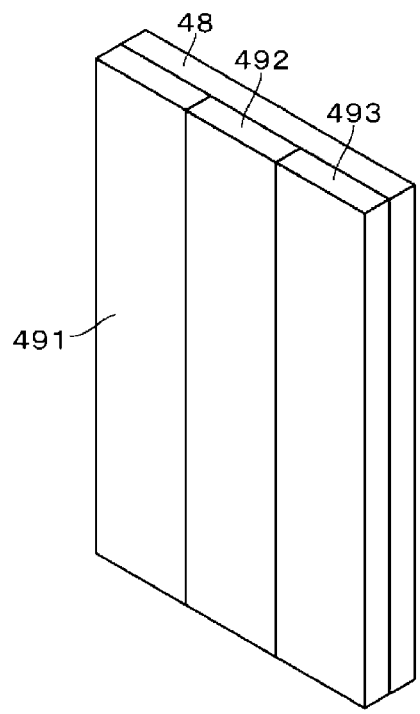
FIG. 19 is a perspective view of a light receiver provided in yet another modification example of the foreign substance detecting unit.

To suppress the increase in size of the circuit, first to third neutral density filters 491 to 493 different from each other in attenuation rate are provided to overlap the light receiver 48 in the example shown in FIG. 19. The neutral density filters 491 to 493 configured to allow the scattered light to pass through toward the light receiver 48 are switched depending on the size of the particle to be detected. More specifically, instead of the first and second BPF 49A and 49B shown in FIG. 16 to FIG. 18, the first to third neutral density filters 491 to 493 are sequentially provided in the left-right direction. The third neutral density filter 493 has the highest attenuation rate, followed by the second neutral density filter 492 and the first neutral density filter 491.

When a large-sized foreign substance P is detected, the scattered light with a high intensity is generated. Thus, the third neutral density filter 493 is located behind the flow path forming unit 14 where the detection is performed (FIG. 20) in order for the scattered light to pass through the third neutral density filter 493. When a medium-sized foreign substance P is detected, the scattered light with a medium intensity is generated. Thus, the second neutral density filter 492 is located behind the flow path forming unit 14 where the detection is performed (FIG. 21) in order for the scattered light to pass through the second neutral density filter 492. When a small-sized foreign substance P is detected, the scattered light with a low intensity is generated. Thus, the first neutral density filter 491 is located behind the flow path forming unit 14 where the detection is performed (FIG. 22) in order for the scattered light to pass through the first neutral density filter 491.

As described above, the neutral density filters 491 to 493 that allows the scattered light generated from the foreign substance P to pass through are switched depending on the size of the foreign substance P to be detected. That is, the attenuation rates of the scattered light are switched. Thus, the level of the signal from the foreign substance to be detected is within the measurable range of the counter 53. Therefore, it is possible to suppress the increase in size of the circuit as described above.

Figure 20:
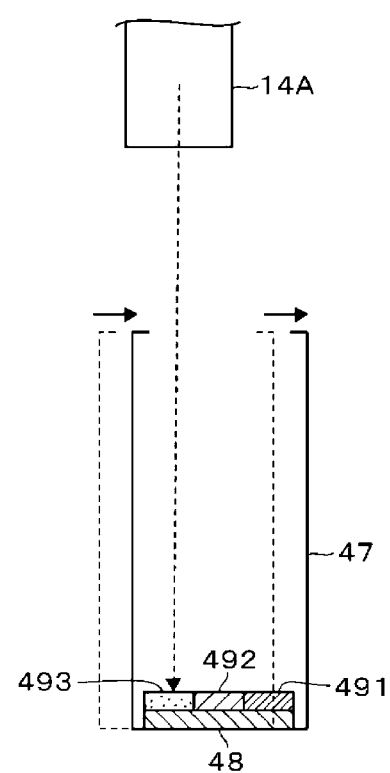
FIG. 20 is an explanatory diagram showing an operation of another modification example of the foreign substance detecting unit.
Figure 21:
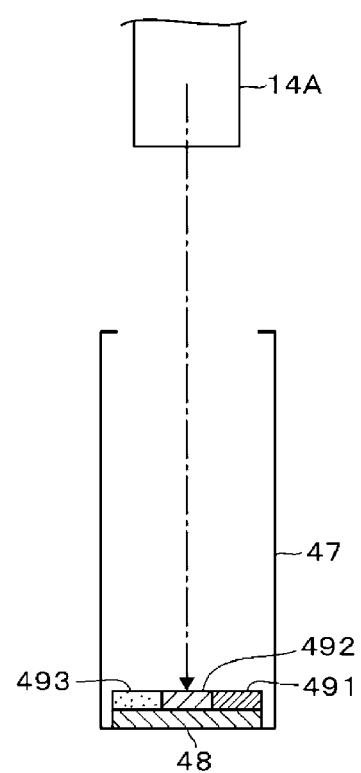
FIG. 21 is an explanatory diagram showing an operation of another modification example of the foreign substance detecting unit.
Figure 22:
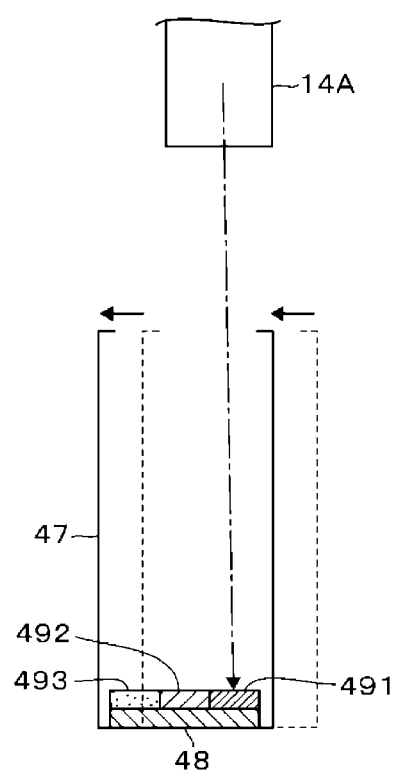
FIG. 22 is an explanatory diagram showing an operation of another modification example of the foreign substance detecting unit.

The apparatus according to the exemplary embodiment shown in FIG. 19 to FIG. 21 may detect the small-sized to the large-sized foreign substances P by measuring the scattered light passing through the respective neutral density filters 491 to 493, or may set the size of the foreign substance P to be detected and perform the detection by allowing the scattered light to pass through only one of the neutral density filters 491 to 493 corresponding to the size of the foreign substance P.

Further, in this exemplary embodiment, the moving mechanism 43 that moves each component of the light path forming unit 4 is used as a mechanism for switching the filters when the neutral density filters are switched. Therefore, without a mechanism exclusively for switching the filters, the moving mechanism 43 (second relative position moving mechanism) switches the filters by moving the relative position of the flow path forming unit 14 with respect to the neutral density filters 491 to 493. Since the mechanism exclusively for switching the filters is not necessary, it is possible to reduce the manufacturing cost and easily perform the maintenance. Here, a mechanism exclusively for switching the filters may also be provided.

Although an example where the neutral density filters are provided to cover the entire light receiver 48 has been described, the neutral density filters may be provided to cover a part of the light receiver 48, and the detection of light that has passed the neutral density filter and the detection of light that has not passed the neutral density filter may be switchably performed. Also, the band pass filter and the neutral density filter may be provided to overlap the light receiver 48 in combination with the exemplary embodiment shown in FIG. 16 to FIG. 18.

The configuration of switching the neutral density filters 491 to 493 that allow the scattered light to pass through as shown in FIG. 19 to FIG. 22 may be applied to the foreign substance detecting unit 2 that uses the laser beam with a wavelength except that of the near-infrared light. Even in this apparatus, it is possible to narrow a range of detection signals to be detected by the light receiver 48. Therefore, it is possible to reduce the number of amplifiers and attenuators for adjusting the level of the detection signal to the measurable range of the counter 53 and suppress the increase in size of the circuit.

Even in a case where the neutral density filters are provided as described above, the flow path forming unit 14 is configured in the same manner as in the case where the BPF 49A and 49B are provided. That is, the flow path forming unit 14 is configured such that the radiation direction of the condensed light is changed depending on the position of the reaction area 40.

Although it has been described that the liquid to be supplied to the flow path forming unit 14 is switched between the coating liquid and the resist in each example shown in FIG. 15 to FIG. 22, the present disclosure is not limited thereto. For example, the coating liquid may be supplied to some of the plurality of flow path forming units 14 and the resist may be supplied to the other flow path forming units 14. Also, the wavelength of the laser beam, a BPF and the like to be used may be selected depending on the flow path forming unit 14.

Although the configuration example where the detection of the foreign substance is performed using the scattered light has been described, the present disclosure is not limited thereto. The detection of the foreign substance may be performed using transmitted light. In this case, a light projector and a light receiver may be disposed to face each other with the flow path forming unit 14 therebetween in order to receive the laser beam that has pass through the flow path forming unit 14 (i.e., light generated from the flow path forming unit 14 as a result of the light radiation to the flow path forming unit 14) and the detection of the a foreign substance is performed based on the transmitted light.

Figure 23:
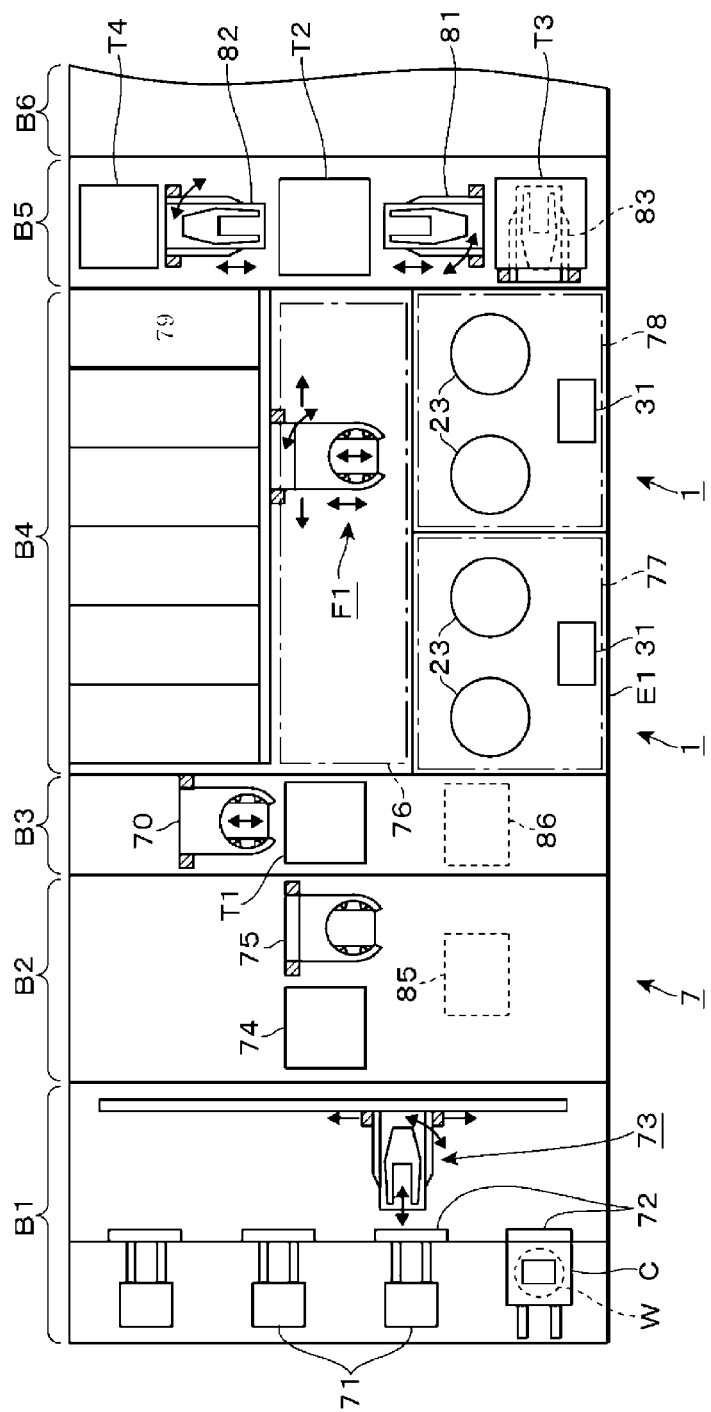
FIG. 23 is a plan view of a coating/developing apparatus equipped with the SOC coating apparatus.
Figure 24:
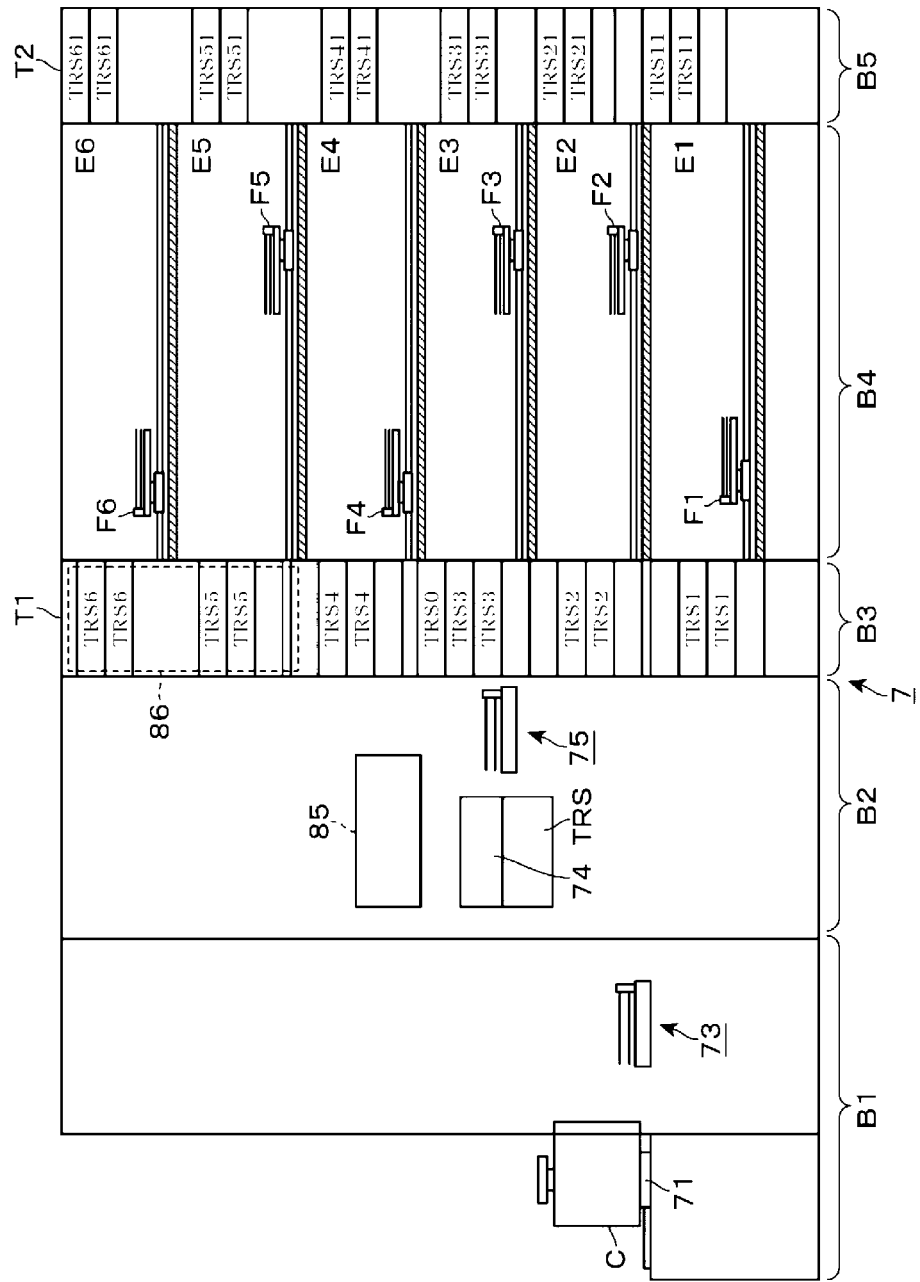
FIG. 24 is a schematic side view of the coating/developing apparatus.

Hereinafter, a coating/developing apparatus 7, which is an example of a substrate processing system including the SOC coating apparatus 1, will be described with reference to the plan view of FIG. 23 and the longitudinal cross-sectional side view of FIG. 24. The coating/developing apparatus 7 is configured to perform forming of an SOC film by coating a surface of a wafer W with a coating liquid, forming of a resist film by a resist and forming of a resist pattern by developing the resist film after exposure. A carrier block B1, an inspection block B2, a multipurpose block B3, a processing block B4 and an interface block B5 are linearly connected in a horizontal direction. The blocks B1 to B5 each have a housing and are separated from each other. In the drawing, reference numeral B6 indicates an exposure apparatus and is connected to the interface block B5.

A wafer W in a carrier C placed on a placing table 71 of the carrier block B1 is transferred between the carrier C and the inspection block B2 by a transfer mechanism 73. In the drawing, reference numeral 72 indicates opening/closing device configured to open/close a separation wall of the carrier block B1 and a cover of the carrier C. The inspection block B2 includes an inspection module 74 configured to inspect a wafer W after a resist pattern is formed thereon, and a delivery module TRS for delivering the wafers W between the multipurpose block B3 and the processing block B4.

The multipurpose block B3 includes a plurality of delivery modules TRS for delivering the wafers W between unit blocks E1 to E6 constituting the processing block B4 and the inspection block B2. The plurality of delivery modules TRS are stacked to constitute a tower T1. Further, a transfer mechanism 70 configured to move up and down to deliver the wafer W to each of the modules of the tower T1 is provided.

The processing block B4 is configured by the unit blocks E1 to E6 which are sequentially stacked in this order from bottom and are configured to perform a liquid processing on the wafers W, and the wafers W are transferred and processed in parallel in the unit blocks E1 to E6. The unit blocks E1, E3 and E5 are configured in the same manner as the unit blocks E2, E4 and E6, respectively. FIG. 23 illustrates the unit block E1 which will be representatively described. The unit block E1 has a transfer area 76 extended from the multipurpose block B3 toward the interface block B5. A transfer mechanism F1 configured to transfer the wafers W to the modules of the tower T1 and the modules of the processing block B4 is provided in the transfer area 76. When viewed from a longitudinal direction of the transfer area 76, a heating module 79 is provided at one of the left and right sides and installation areas 77 and 78 of the SOC coating apparatus 1 are provided at the other side. Further, the left and right sides stated herein are not the same as the left and right sides used in the description of the foreign substance detecting unit 2.

The installation areas 77 and 78 are disposed in the longitudinal direction of the transfer area 76. The two cups 23, the two spin chucks 21, the arm 24 supporting the nozzles 11A to 11L, the moving mechanism 25 and the housing 31 of the foreign substance detecting unit 2 are disposed in each of the installation areas 77 and 78. That is, a plurality of sets of the substrate placing tables and the nozzles is provided in the unit block E1. The cups 23 are arranged in a row in the longitudinal direction of the transfer area 76. Further, the housing 31 is provided opposite to the transfer area 76 when viewed from the row of the cups 23. Further, the processing liquid supply pipes 12A to 12L and the processing liquid supplies 13A to 13L connected to the nozzles 11A to 11L are drawn around the multipurpose block B3 from the installation areas 77 and 78 and are connected to the pumps of the processing liquid supplies 13 provided in the multipurpose block B3.

The unit blocks E3 and E4 have the same configuration as the unit blocks E1 and E2 except that a resist module configured to form a resist film by supplying a resist to the installation areas 77 and 78 is provided. The resist module (resist coating apparatus) has the same configuration as the SOC coating apparatus 1 except that the resist is supplied to the wafer W and the wavelength of the laser beam for inspection corresponds to the resist as described above. The unit blocks E5 and E6 have the same configuration as the unit blocks E1 and E2 except that a developer module configured to perform development by supplying a developing liquid to the installation areas 77 and 78 is provided. Further, in FIG. 24, the transfer mechanisms of the unit blocks E2 to E6 that correspond to the transfer mechanism F1 of the unit block E1 are denoted by F2 to F6.

The interface block B5 has towers T2, T3 and T4 vertically extended throughout the unit blocks E1 to E6. The tower T2 has delivery modules TRS disposed at heights corresponding to the unit blocks E1 to E6 and transfers the wafers W to the delivery modules TRS at the heights corresponding to the transfer mechanisms F1 to F6, respectively. Further, the interface block B5 is provided with a transfer mechanism 81 configured to move up and down to deliver the wafer W between the tower T2 and the tower T3, a transfer mechanism 82 configured to move up and down to transfer the wafer W to the tower T2 and the tower T3 and a transfer mechanism 83 configured to transfer the wafer W between the tower T2 and the exposure apparatus B6. A detailed description of the modules of the towers T3 and T4 will be omitted herein.

A transfer route of the wafers W in the coating/developing apparatus 7 will be described. A wafer W is transferred to the delivery module TRS of the inspection block B2 by the transfer mechanism 73 from the carrier C and then transferred to a delivery module TRS0 of the tower T1 of the multipurpose block B3 via a transfer mechanism 75. From here, the wafers W are allocated and transferred to the unit blocks E1 and E2 by the transfer mechanism 70.

The allocated wafers W are transferred to the cups 23 of the SOC coating apparatus 1 in the unit blocks E1 and E2 through the delivery modules TRS1 and TRS2 and subjected to pre-wetting and SOC coating. In parallel with this process, the detection of the foreign substance described with reference to FIG. 8 is performed. Then, the wafers W are transferred to and heated in the heating module 79, transferred to delivery modules TRS3 and TRS4 of the tower T1 and then allocated and transferred to the unit blocks E3 and E4. Then, the wafers W are subjected to pre-wetting and SOC coating in the resist module. In parallel with this process, the detection of the foreign substance as described above with reference to FIG. 8 is performed. Thereafter, the wafers W are transferred to and heated in the heating module 79, transferred to delivery modules TRS13 and TRS41 of the tower T2 and then put into the exposure apparatus B6 via the tower T2 by the transfer mechanisms 82 and 83, and the resist films are exposed.

The wafers W after the exposure are transferred between the towers T2 and T4 by the transfer mechanisms 83 and 82 and are respectively transferred to the delivery modules TRS51 and TRS61 of the tower T2 corresponding to the unit blocks E5 and E6. Thereafter, the wafers W are transferred to the heating module 79 and subjected to post-exposure heating (post-exposure bake). Then, the wafers W are transferred to the developing module and the developing liquid is supplied to form the resist patterns. Thereafter, the wafers W are transferred to the inspection module 74 of the inspection block B2 via the delivery modules TRS4 to TRS6 of the tower T1 and the transfer mechanism 75, are inspected, and then are returned back to the carriers C through the transfer mechanism 73.

In the coating/developing apparatus 7, the housing 31 is provided close to the cup 23. More specifically, the foreign substance detecting unit 2 is provided in the same unit block E as the unit block E provided with the cup 23. With this arrangement, the lengths of the flow paths from the flow path forming units 14A to 14L to the nozzles 11A to 11L can be made relatively short. Considering that the foreign substance can be produced from the processing liquid supply pipes 12A to 12L, a difference in the amount of the foreign substance between the flow path forming units 14A to 14L and the nozzles 11A to 11L is suppressed by making the lengths of the flow paths short. Accordingly, it is possible to monitor the cleanliness of the processing liquid, which is supplied to the wafers W, with a high accuracy.

However, each housing 31 is not necessarily provided close to the cup 23 in the unit blocks E1 to E3 and may be provided close to the inspection block B2 and the multipurpose block B3, which are relatively far from the cup 23. Reference numerals 85 and 86 in FIG. 23 may indicate an example of the installation area of the housing in the inspection block B2 and the multipurpose block B3 and, for example, a plurality of housings 31 may be installed in the housing installation area 85 or 86. That is, the foreign substance detecting unit 2 may be provided in a block separated from the carrier block B1 and the processing block B4, and it is possible to supply the processing liquid from the flow path forming unit 14 of the foreign substance examination block 2 disposed in this manner to the nozzles 11A to 11L in the unit blocks E1 to E4. In order to reduce the occupying space, the housings 31 provided in the housing installation areas 85 and 86 are stacked.

Figure 25:
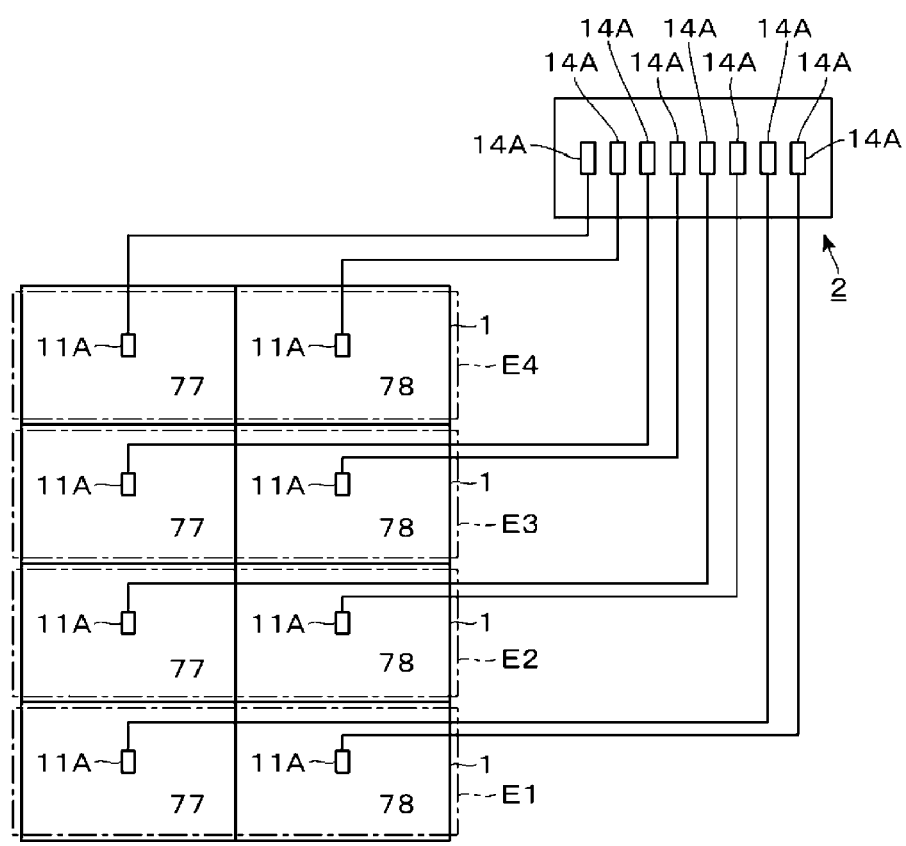
FIG. 25 is an explanatory diagram showing placement of the foreign substance detecting unit in the coating/developing apparatus.

Meanwhile, in the example described above, the detection of the foreign substance is performed for all the processing liquids that are discharged from the nozzles 11A to 11L. However, the detection of the foreign substance is not necessarily performed for all the processing liquids, and may be performed only for processing liquids requiring a high cleanliness. FIG. 25 shows a configuration example where the detection of the foreign substance is performed only for the flow path forming unit 14A connected to the SOC coating apparatus 1 provided in the installation areas 77 and 78 of the unit blocks E1 and E2 and the nozzle 11A of the resist coating apparatus provided in the installation areas 77 and 78 of the unit blocks E3 and E4.

The housing 31 shown in FIG. 25 is provided in, for example, the housing installation area 85 or 86. Further, in the housing 31, the flow path forming units 14A to 14L are not accommodated, but the flow path forming unit 14A corresponding to the nozzle 11A provided in each of the installation areas 77 and 78 is accommodated. That is, in the example shown in FIG. 25, four SOC coating apparatuses 1 and four resist coating apparatus share one foreign substance detecting unit 2. The foreign substance detecting unit 2 according to the present disclosure can detect the foreign substance in various processing liquids and can be shared by the SOC coating apparatus 1 and the resist coating apparatus. With this configuration, it is possible to reduce the cost of manufacturing and operating the coating/developing apparatus 7.

Further, when the foreign substance detecting unit 2 is shared by the apparatus 1, such as the SOC coating apparatus 1, and the resist coating apparatus that use different processing liquids as described above, a processing in the SOC coating apparatus 1 and a processing in the resist coating apparatus may be performed in parallel. For this reason, it is effective to provide a plurality of detections sets described above with reference to FIG. 15.

The processing liquid, which is the target of the detection of the foreign substance, may be, for example, a developing liquid, a cleaning liquid for cleaning wafers W, a chemical liquid for forming an antireflection film, a chemical for forming an insulating film, an adhesive for bonding wafers W, etc. Accordingly, the substrate processing apparatus may be a developing apparatus or a cleaning apparatus.

Further, the processing liquid supply pipes 12A to 12K may be configured such that, for example, the coating liquid and the cleaning liquid are switchably supplied from the upstream side and the thinner is discharged to places other than the wafers W from the nozzles 11. The thinner is a cleaning liquid for the processing liquid supply pipes 12A to 12K, and similar to the coating liquid, the detection of the foreign substance may be performed for the cleaning liquid while the cleaning liquid flows through the processing liquid supply pipes 12A to 12K. When the detection of the foreign substance is performed for the cleaning liquid, it is possible to suppress a waste of the processing liquid, which is used for cleaning, by stopping the cleaning at an appropriate timing based on the detection result. The processing liquid supply pipes 12A to 12K may be automatically cleaned based on the result of detection of the foreign substance in the coating liquid. As described above, the present disclosure can be applied to the detection of the foreign substance in the liquid flowing through the flow paths through which the processing liquids flow, and is not limited to the detection of the foreign substance contained in the processing liquids that are supplied to the wafers W.

Further, for example, in the developing apparatus, a gas nozzle that supplies an inert gas to the wafers W may be provided to dry the wafers W after the development. Further, the detection of the foreign substance may be performed for a flow path connected to an upstream side of the gas nozzle. That is, in the present disclosure, the detection of the foreign substance may be performed not only for a liquid but for a gas.

The exemplary embodiments disclosed herein are illustrative in all aspects and do not limit the present disclosure. Further, the above-described exemplary embodiments may be omitted, substituted, or changed in various forms without departing from the scope and spirit of the appended claims.

[Verification Test]

To verify the effect of the substrate processing apparatus according to the present disclosure, transmittances (transmittance=(incident light amount−absorption loss−scattering loss)/incident light amount) are respectively measured by radiating the laser beams with wavelengths of 670 nm, 830 nm and 940 nm to samples 1 and 2 which are the coating liquids for forming the SOC film containing different ingredients from each other. Also, the samples are colored liquids.

Figure 26:
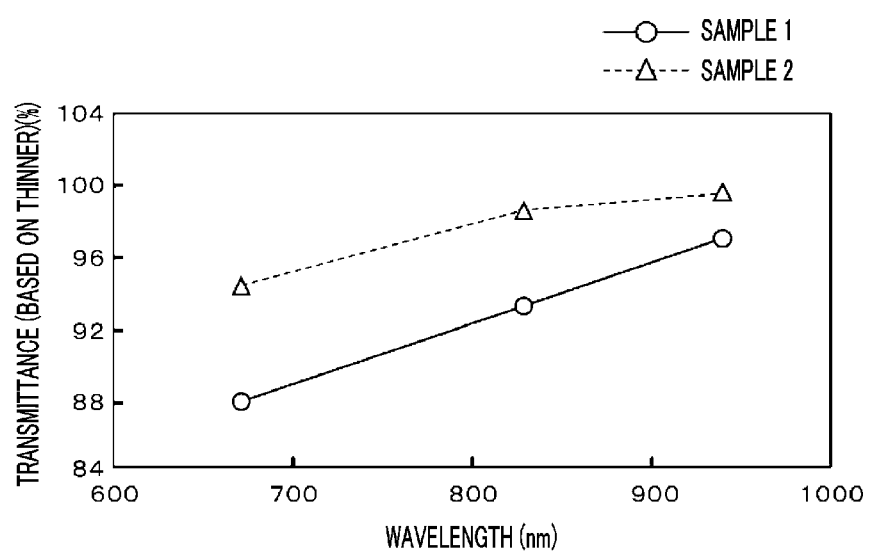
FIG. 26 is a graph showing a test result of a verification test.

FIG. 26 shows a result of the verification test, and values on the vertical axis indicate the values of transmittances measured from the samples 1 and 2 in percent with respect to a value of a transmittance of the thinner as measured by using the laser beam with the same wavelength. As shown in the graph, the samples 1 and 2 shows the transmittances of more than 90% at wavelengths of 830 nm and 940 nm. Further, when the detection of the foreign substance in the liquid is performed, a desirable transmittance of the chemical liquid is 90% or more with respect to the transmittance of the thinner. It is found out from the graph that both the samples 1 and 2 shows the transmittances of 90% or more at a wavelength of 750 nm or more. Further, since it is clear that the transmittance is 90% or more at 830 nm, the wavelength is desirably 750 nm or more, and more desirably 830 nm or more. Therefore, when the detection is performed as described above, it is desirable to radiate the near-infrared light to the liquid.

Also, damage to the flow paths to which the samples 1 and 2 are allowed to flow when the laser beams with respective wavelengths are radiated to the samples 1 and 2, and the presence or absence of fluorescence when the laser beams are radiated to the samples 1 and 2 are examined. The damage to the flow paths and the presence or absence of fluorescence become an index of tendency of the samples to absorb the laser beams.

As for both the samples 1 and 2, the damage to the flow paths are not observed when the laser beam with a certain wavelength is radiated. Also, as for both the samples 1 and 2, the fluorescence is observed when the laser beam with a wavelength of 670 nm is radiated. That is, the laser beam is absorbed. Further, as for both the samples 1 and 2, the fluorescence is observed when the laser beam with a wavelength of 830 nm is radiated. However, as for the sample 1, the amount of fluorescence is extremely small. Also, the fluorescence is not observed from any one of the samples 1 and 2 when the laser beam with a wavelength of 940 nm is radiated. Therefore, it is estimated that it is possible to suppress the absorption by the coating liquids by using the laser beam with the wavelength of about 750 nm or more in view of the presence or absence of fluorescence and the damage to the flow paths. Also, it is confirmed that a more desirable wavelength is 830 nm or more.

According to the present disclosure, it is possible to apply the substrate processing apparatus, which is configured to optically detect the foreign substance in the supply channel through which the liquid to be supplied to the substrate flows, in various kinds of liquids.

From the foregoing, it will be appreciated that various exemplary embodiments of the present disclosure have been described herein for purposes of illustration and various changes can be made without departing from the scope and spirit of the present disclosure. Accordingly, various exemplary embodiments described herein are not intended to be limiting, and the true scope and spirit are indicated by the following claims.

We claim:

1. A substrate processing apparatus, comprising:
a supply channel through which a liquid to be supplied to a substrate flows; and
a foreign substance detecting unit configured to detect a foreign substance in the liquid based on a signal obtained when light, which is near-infrared light, is radiated toward a flow path forming unit constituting a part of the supply channel by a light projector so that light is emitted from the flow path forming unit and a light receiver receives the light emitted from the flow path forming unit,
wherein the light projector and the light receiver in the foreign substance detecting unit are provided in areas that do not face each other among up/down, left/right and front/rear areas with respect to the flow path forming unit such that the light receiver receives scattered light as the light emitted from the flow path forming unit.

2. The substrate processing apparatus of claim 1, wherein the light projector is configured to radiate light with a peak wavelength of 830 nm or more.

3. The substrate processing apparatus of claim 1, wherein the liquid is a colored liquid.

4. The substrate processing apparatus of claim 1, wherein the light projector includes:
a light source; and
a front end-side light path forming unit configured to form a light path from the light source toward the flow path forming unit, and
the front end-side light path forming unit includes an antireflection film.

5. The substrate processing apparatus of claim 1, further comprising:
a rear end-side light path forming unit configured to form a light path of transmitted light which passes through a reaction area where the light radiated from the light projector is condensed in the flow path forming unit and the scattered light is generated,
wherein the rear end-side light path forming unit includes an antireflection film.

6. The substrate processing apparatus of claim 5, wherein the rear end-side light path forming unit is configured to guide the transmitted light to a transmitted light detector configured to detect the transmitted light or a light absorber configured to absorb the transmitted light.

7. The substrate processing apparatus of claim 1, further comprising:
a light receiving-side light path forming unit configured to guide the light emitted from the flow path forming unit to the light receiver,
wherein the light receiving-side light path forming unit includes a band pass filter, and a pass band of the band pass filter includes a peak wavelength of the light radiated from the light projector.

8. The substrate processing apparatus of claim 7, wherein the light projector selectively radiates first light and second light to the flow path forming unit, the first light and the second light having different wavelengths from each other and at least one of the first light or the second light being the near-infrared light,
the light receiving-side light path forming unit configured to guide the light emitted from the flow path forming unit to the light receiver is provided,
the light receiving-side light path forming unit includes a first band pass filter and a second band pass filter, pass bands of the first band pass filter and the second band pass filter including a peak wavelength of the first light and a peak wavelength of the second light, respectively, and being different from each other, and
a first relative position changing mechanism configured to change a relative position of the light receiving-side light path forming unit with respect to the flow path forming unit such that one of the first band pass filter and the second band pass filter is located on a light path of the light emitted from the flow path forming unit depending on the light radiated from the light projector to the flow path forming unit is provided.

9. The substrate processing apparatus of claim 8, wherein the flow path forming unit includes multiple flow path forming units, and a row of the multiple flow path forming units is formed in a direction different from an arrangement direction of the light projector and the light receiver with respect to one flow path forming unit,
the light receiving-side light path forming unit, the light receiver and the light projector are shared by the multiple flow path forming units,
a moving mechanism configured to move the light receiving-side light path forming unit, the light receiver and the light projector along the row of the multiple flow path forming units such that the light receiving-side light path forming unit, the light receiver and the light projector are located at a position corresponding to the flow path forming unit selected from the multiple flow path forming units is provided,
the first band pass filter and the second band pass filter are provided along the row of the multiple flow path forming units, and
the first relative position changing mechanism is the moving mechanism.

10. The substrate processing apparatus of claim 1, further comprising:
a light receiving-side light path forming unit configured to guide the light emitted from the flow path forming unit to the light receiver;
a second relative position changing mechanism configured to change a relative position of the light receiving-side light path forming unit with respect to the flow path forming unit; and
a neutral density filter provided in the light receiving-side light path forming unit and configured to change an attenuation rate of the light emitted from the flow path forming unit depending on the relative position.

11. The substrate processing apparatus of claim 10, wherein the flow path forming unit includes multiple flow path forming units, and a row of the multiple flow path forming units is formed in a direction different from an arrangement direction of the light projector and the light receiver with respect to one flow path forming unit,
the light receiving-side light path forming unit, the light receiver and the light projector are shared by the multiple flow path forming units,
a moving mechanism configured to move the light receiving-side light path forming unit, the light receiver and the light projector along the row of the multiple flow path forming units such that the light receiving-side light path forming unit, the light receiver and the light projector are located at a position corresponding to a flow path forming unit selected from the multiple flow path forming units is provided, and the second relative position changing mechanism is the moving mechanism.

12. The substrate processing apparatus of claim 1, further comprising:
a spectrometer; and
a branch light path forming unit configured to divide a light path of the light emitted from the flow path forming unit and configured to guide the light to the spectrometer and the light receiver.

13. The substrate processing apparatus of claim 1,
wherein the light receiver includes a first light receiver and a second light receiver,
wherein the foreign substance detecting unit is further configured to perform detection of the foreign substance based on a signal obtained from the first light receiver and a signal obtained from the second light receiver,
wherein the substrate processing apparatus further includes:
an optical system configured to selectively radiate light emitted from the flow path forming unit by the foreign substance to one of the first light receiver and the second light receiver.

14. The substrate processing apparatus of claim 1,
wherein the liquid is a processing liquid to be supplied to the substrate and is configured to process the substrate, and
wherein the substrate processing apparatus further includes:
a substrate placing table on which the substrate is placed;
a nozzle provided at a downstream end of the supply channel and configured to supply the processing liquid to the substrate placed on the substrate placing table; and
a processing liquid supply configured to supply the processing liquid to the supply channel such that the processing liquid is discharged from the nozzle.

15. A substrate processing apparatus, comprising:
a supply channel through which a liquid to be supplied to a substrate flows; and
a foreign substance detecting unit configured to detect a foreign substance in the liquid based on a signal obtained when light, which is near-infrared light, is radiated toward a flow path forming unit constituting a part of the supply channel by a light projector so that light is emitted from the flow path forming unit and a light receiver receives the light emitted from the flow path forming unit,
wherein the flow path forming unit includes multiple flow path forming units, and a row of the multiple flow path forming units is formed in a direction different from an arrangement direction of the light projector and the light receiver with respect to one flow path forming unit,
the light receiver and the light projector are shared by the multiple flow path forming units, and
a moving mechanism configured to move the light receiver and the light projector along the row of the multiple flow path forming units such that the light receiver and the light projector are located at a position corresponding to the flow path forming unit selected from the multiple flow path forming units is provided.

16. The substrate processing apparatus of claim 15,
wherein the light projector includes a first light projector and a second light projector shared by the multiple flow path forming units, at least one of the first light projector or the second light projector radiating the near-infrared light,
the light receiver includes a first light receiver forming a set with the first light projector and a second light receiver forming a set with the second light projector shared by the multiple flow path forming units, and
the moving mechanism moves the light projector and the light receiver included in one of the sets to a position corresponding to the flow path forming unit depending on a kind of a liquid flowing through the selected flow path forming unit.

17. A substrate processing method performed in a substrate processing apparatus,
wherein the substrate processing apparatus includes:
a supply channel through which a liquid to be supplied to a substrate flows; and
a foreign substance detecting unit configured to detect a foreign substance in the liquid based on a signal obtained when light, which is near-infrared light, is radiated toward a flow path forming unit constituting a part of the supply channel by a light projector so that light is emitted from the flow path forming unit and a light receiver receives the light emitted from the flow path forming unit,
wherein the substrate processing method includes:
generating light toward the flow path forming unit constituting the part of the supply channel by the light projector;
receiving light emitted from the flow path forming unit by the light receiver as a result of the generating of the light toward the flow path forming unit; and
detecting a foreign substance in the liquid based on a signal obtained by the receiving of the light,
wherein the light projector and the light receiver in the foreign substance detecting unit are provided in areas that do not face each other among up/down, left/right and front/rear areas with respect to the flow path forming unit such that the light receiver receives scattered light as the light emitted from the flow path forming unit.

* * * * *